United States Patent
Chou et al.

(10) Patent No.: US 11,923,392 B2
(45) Date of Patent: Mar. 5, 2024

(54) ENHANCED DESIGN FOR IMAGE SENSING TECHNOLOGY

(71) Applicant: Taiwan Semiconductor Manufacturing Co., Ltd., Hsin-Chu (TW)

(72) Inventors: Keng-Yu Chou, Kaohsiung (TW);
Chun-Hao Chuang, Hsinchu (TW);
Jen-Cheng Liu, Hsin-Chu (TW);
Kazuaki Hashimoto, Zhubei (TW);
Ming-En Chen, Tainan (TW);
Shyh-Fann Ting, Tainan (TW);
Shuang-Ji Tsai, Tainan (TW);
Wei-Chieh Chiang, Yuanlin Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 263 days.

(21) Appl. No.: 17/140,346

(22) Filed: Jan. 4, 2021

(65) Prior Publication Data
US 2022/0216260 A1 Jul. 7, 2022

(51) Int. Cl.
*H01L 27/146* (2006.01)
*H04N 25/11* (2023.01)
*H04N 25/77* (2023.01)

(52) U.S. Cl.
CPC .. *H01L 27/14627* (2013.01); *H01L 27/14636* (2013.01); *H01L 27/14685* (2013.01); *H04N 25/77* (2023.01); *H04N 25/11* (2023.01)

(58) Field of Classification Search
CPC ......... H01L 27/14627; H01L 27/14636; H01L 27/14685; H04N 25/77
See application file for complete search history.

(56) References Cited

U.S. PATENT DOCUMENTS

| 9,893,111 B2 | 2/2018 | Chou |
| 9,905,605 B2 | 2/2018 | Hsu |
| 10,002,899 B2 | 6/2018 | Chou |

(Continued)

FOREIGN PATENT DOCUMENTS

| JP | 2013033864 A | 2/2013 |
| JP | 2014027178 A | 2/2014 |
| WO | 2018208964 A1 | 11/2018 |

OTHER PUBLICATIONS

Notice of Allowance dated Oct. 5, 2021 in connection with U.S. Appl. No. 17/019,502.
U.S. Appl. No. 17/019,502, filed on Sep. 14, 2020.

*Primary Examiner* — Yara B Green
*Assistant Examiner* — Fakeha Sehar
(74) *Attorney, Agent, or Firm* — Eschweiler & Potashnik, LLC

(57) ABSTRACT

The present disclosure relates to an integrated chip. The integrated chip includes an image sensing element disposed within a substrate. A gate structure is disposed along a front-side of the substrate. A back-side of the substrate includes one or more first angled surfaces defining a central diffuser disposed over the image sensing element. The back-side of the substrate further includes second angled surfaces defining a plurality of peripheral diffusers laterally surrounding the central diffuser. The plurality of peripheral diffusers are a smaller size than the central diffuser.

20 Claims, 14 Drawing Sheets

(56) References Cited

U.S. PATENT DOCUMENTS

| | | |
|---|---|---|
| 10,050,078 B2 | 8/2018 | Jin et al. |
| 10,367,023 B1 | 7/2019 | Chou et al. |
| 10,397,465 B2 | 8/2019 | Galor Gluskin |
| 10,510,797 B2* | 12/2019 | Chiang ............. H01L 27/14689 |
| 2007/0298533 A1 | 12/2007 | Yang et al. |
| 2009/0004840 A1* | 1/2009 | Farinelli .............. H05K 3/3457 |
| | | 216/18 |
| 2015/0179856 A1 | 6/2015 | Abe et al. |
| 2016/0112614 A1* | 4/2016 | Masuda ................ H04N 25/70 |
| | | 348/374 |
| 2017/0110493 A1* | 4/2017 | Yokogawa ........ H01L 31/03762 |
| 2017/0141151 A1 | 5/2017 | Sato |
| 2018/0337211 A1 | 11/2018 | Su et al. |
| 2018/0367747 A1 | 12/2018 | Mo |
| 2019/0027518 A1* | 1/2019 | Miyata ............. H01L 27/14621 |
| 2019/0096930 A1 | 3/2019 | Chuang |
| 2019/0096945 A1 | 3/2019 | Lu |
| 2019/0096951 A1 | 3/2019 | Cheng et al. |
| 2019/0378863 A1 | 12/2019 | Chou et al. |
| 2020/0027909 A1 | 1/2020 | Ebiko et al. |
| 2020/0098801 A1 | 3/2020 | Chou |
| 2020/0098814 A1 | 3/2020 | Yang |
| 2020/0135792 A1* | 4/2020 | Wu .................. H01L 27/14685 |
| 2020/0219913 A1 | 7/2020 | Lee |
| 2020/0410207 A1* | 12/2020 | He ......................... G02B 6/005 |
| 2020/0411487 A1 | 12/2020 | Andrews |
| 2021/0183922 A1 | 6/2021 | Chou |
| 2021/0265414 A1 | 8/2021 | Chiang |
| 2022/0173150 A1* | 6/2022 | Kurose ............. H01L 27/14632 |

* cited by examiner

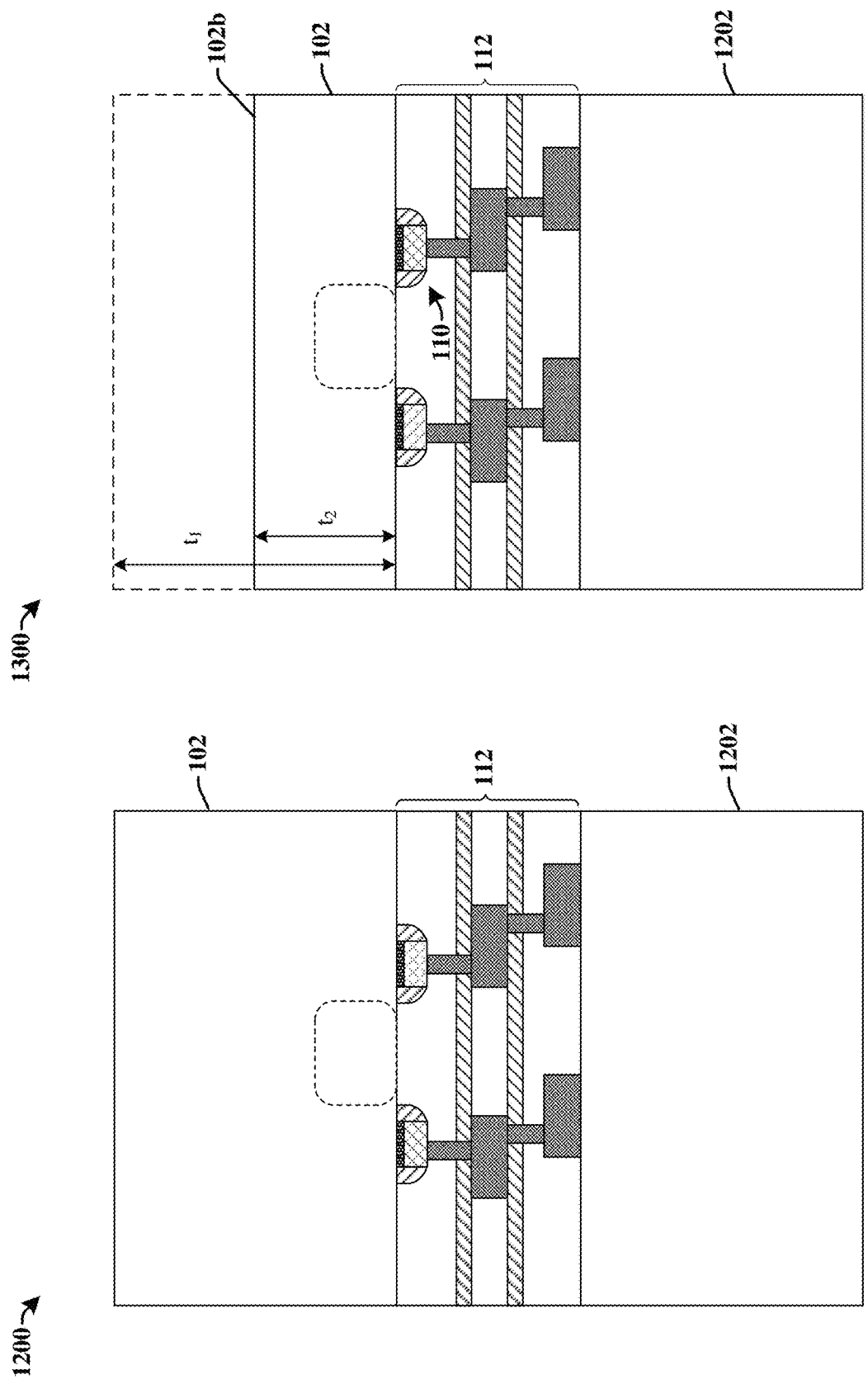

ENHANCED DESIGN FOR IMAGE SENSING TECHNOLOGY

BACKGROUND

Integrated chips (ICs) with image sensors are used in a wide range of modern day electronic devices. In recent years, complementary metal-oxide semiconductor (CMOS) image sensors have begun to see widespread use, largely replacing charge-coupled device (CCD) image sensors. Compared to CCD image sensors, CMOS image sensors are increasingly favored due to low power consumption, a small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9-20 illustrate cross-sectional views of some embodiments of a method of forming an image sensor IC having different sized diffusers.

DETAILED DESCRIPTION

Figure 1:
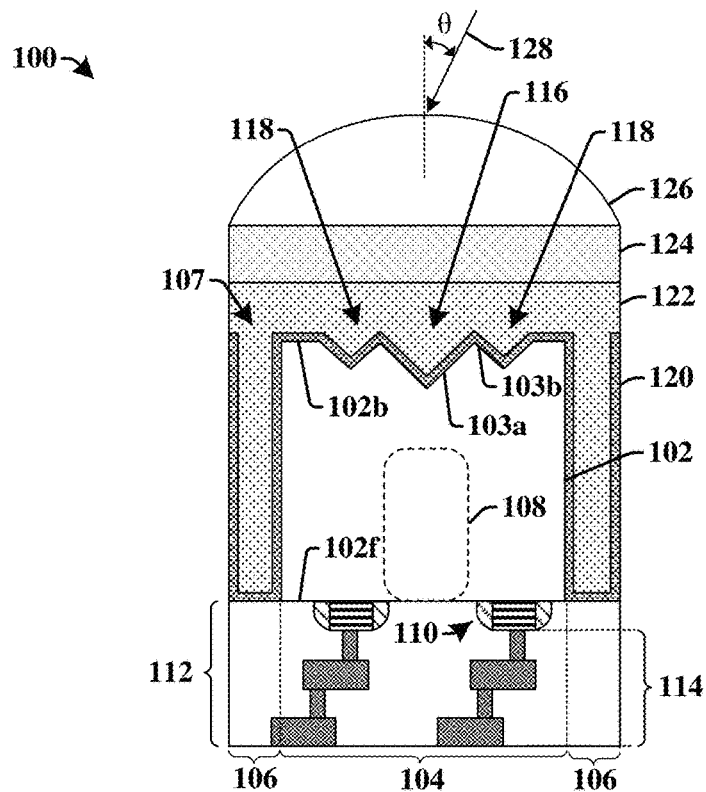
FIG. 1 illustrates a cross-sectional view of some embodiments of an image sensor integrated chip (IC) having different sized diffusers configured to provide a good quantum efficiency to an image sensor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In recent years, image sensor integrated chips (ICs) with capabilities to detect near-infrared radiation (NIR) (e.g., radiation having a wavelength between approximately 900 nm and approximately 2,500 nm) have becoming increasingly common. One reason for this is that image sensor ICs that are able to detect NIR are able to operate effectively with little to no visible light, thereby making such image sensor ICs ideal for machine and/and night vision cameras. Additionally, because the night sky contains more NIR photons than visible photons, the ability of an image sensor IC to detect NIR radiation allows for good image capture without the use of extra illumination (e.g., LEDs), thereby decreasing power consumption and increasing battery life of the image sensor IC.

Image sensor ICs typically comprise an image sensing element (e.g., a photodiode) disposed within a silicon substrate. However, the absorption coefficient of silicon decreases as a wavelength of radiation increases. Therefore, image sensor ICs are normally able to detect NIR radiation with a relatively low quantum efficiency (e.g., a ratio of the number of photons that contribute to an electric signal generated by an image sensing element within a pixel region to the number of photons incident on the pixel region).

It has been appreciated that the quantum efficiency of back-side illuminated (BSI) image sensors can be improved by etching a silicon substrate to form angled surfaces that define one or more diffusers along a back-side of the silicon substrate. The angled surfaces of the diffusers are configured to reduce reflection of incident radiation away from the back-side of the silicon substrate and to also change an angle of incident radiation that is entering the silicon substrate. By changing the angle of incident radiation that is entering the silicon substrate, the radiation will travel a longer path within the silicon substrate and thereby increase absorption and quantum efficiency.

It has also been appreciated that a quantum efficiency of an image sensor will be improves by a greater amount by large diffusers than by small diffusers. For example, placing a large diffuser (e.g., a diffuser having a width that is similar to a wavelength of NIR radiation) at a center of a pixel region will provide for a better quantum efficiency than multiple small diffusers (e.g., diffusers having a width that is substantially less than a wavelength of NIR radiation) covering a same area. However, because the size of pixel regions is often relatively small (e.g., between approximately 2 μm and approximately 3 μm), an area of a pixel region over which large diffusers can be place is limited. For example, the placement of a large diffuser over a center of a pixel region often does not leave room for additional large diffusers within the pixel region. Furthermore, while a large diffuser placed at a center of a pixel region will provide for a good quantum efficiency over small angles of incidence, the large diffuser will not provide for a good quantum efficiency over larger angles of incidence. This is because as an angle of incident radiation increases, a focus of the incident radiation moves away from a centralized large diffuser and towards a periphery of the pixel region.

The present disclosure, in some embodiments, relates to an image sensor integrated chip (IC) comprising a substrate having a back-side that includes angled surfaces within a pixel region. The angled surfaces define a central diffuser surrounded by a plurality of peripheral diffusers. The central diffuser has a larger size (e.g., depth and/or width) than the plurality of peripheral diffusers, so that the central diffuser is able to provide the image sensor IC with a good quantum efficiency at small angles of incidence (e.g., between approximately −10° and approximately 10°). Furthermore, the plurality of peripheral diffusers are able to provide the image sensor IC with a good quantum efficiency at larger angles of incidence (e.g., less than approximately −10° and greater than approximately 10°). Therefore, the combination of the central diffuser and the plurality of peripheral diffusers collectively provide the image sensor IC with a good quantum efficiency over a broad range of angles of incidence.

FIG. 1A illustrates some embodiments of an image sensor integrated chip (IC) 100 having different sized diffusers configured to provide a good quantum efficiency to an image sensor.

The image sensor IC 100 comprises a substrate 102 having a pixel region 104 surrounded by one or more isolation regions 106. In some embodiment, the substrate 102 may comprise silicon, germanium, gallium arsenide, or another semiconductor material. An image sensing element 108 is disposed in the substrate 102 within the pixel region 104. The image sensing element 108 is configured to convert incident radiation (e.g., photons) into an electric signal (i.e., to generate electron-hole pairs from the incident radiation). In various embodiments, the image sensing element 108 may comprise a photodiode, a photodetector, or the like.

The substrate 102 has a front-side 102f and a back-side 102b. In some embodiments, one or more gate structures 110 may be disposed along the front-side 102f of the substrate 102 and within the pixel region 104. In some embodiments, the one or more gate structures 110 may correspond to a transfer transistor, a source-follower transistor, a row select transistor, and/or a reset transistor. In some embodiments, a dielectric structure 112 is also arranged along the front-side 102f of the substrate 102 and on the one or more gate structures 110. The dielectric structure 112 surrounds a plurality of conductive interconnect layers 114.

The back-side 102b of the substrate 102 comprises a plurality of angled surfaces 103a-103b within the pixel region 104. In some embodiments, the one or more isolation regions 106 may comprise one or more isolation trenches 107 arranged within the back-side 102b of the substrate 102 and laterally surrounding the pixel region 104. An anti-reflective material 120 is disposed along the back-side 102b of the substrate 102. The anti-reflective material 120 lines the plurality of angled surfaces 103a-103b and extends into the one or more isolation trenches 107. One or more dielectric materials 122 are disposed on the anti-reflective material 120. The one or more dielectric materials 122 may also extend to within the one or more isolation trenches 107 and directly between the plurality of angled surfaces 103a-103b.

A color filter 124 is arranged on the one or more dielectric materials 122. The color filter 124 is configured to transmit specific wavelengths of incident radiation. For example, the color filter 124 may be configured to transmit radiation having wavelengths within a first range (e.g., corresponding to green light), while reflecting radiation having wavelengths within a second range (e.g., corresponding to red light) different than the first range, etc. A micro-lens 126 is disposed on the color filter 124. In some embodiments, the micro-lens 126 may be laterally aligned with the color filter 124 and substantially centered over the pixel region 104.

The plurality of angled surfaces 103a-103b define a plurality of tapered cavities having different sizes. The plurality of tapered cavities may be configured to act as optical diffusers and/or resonant cavities. In some embodiments, one or more first angled surfaces 103a form a first tapered cavity defining a central diffuser 116 and second angled surfaces 103b form second tapered cavities defining a plurality of peripheral diffusers 118 laterally surrounding the central diffuser 116. The central diffuser 116 has a larger size (e.g., depth and/or width) than respective ones of the plurality of peripheral diffusers 118. In some embodiments, the central diffuser 116 may be arranged directly over the image sensing element 108. In some embodiments, the central diffuser 116 is closer to a center of the micro-lens 126 than respective ones of the plurality of peripheral diffusers 118. In some embodiments, the central diffuser 116 is disposed directly below the center of the micro-lens 126.

During operation, the micro-lens 126 is configured to focus the incident radiation 128 (e.g., near-infrared radiation) towards the image sensing element 108. For incident radiation 128 striking the substrate 102 at an angle greater than a critical angle, the plurality of angled surfaces 103a-103b may act to reflect the incident radiation 128 to within the central diffuser 116 or to within the plurality of peripheral diffusers 118, where a portion of the incident radiation 128 can strike another surface of the substrate 102 and subsequently enter into the substrate 102. Because the incident radiation 128 is reflected off of multiple angled surfaces of the substrate 102, the incident radiation 128 will enter the substrate 102 at different angles (e.g., the incident radiation 128 will be diffused). The different angles allow for some of the incident radiation 128 to enter the substrate 102 along angles that increase a path length of the incident radiation 128 in the substrate 102. By increasing a path length of the incident radiation 128 in the substrate 102, absorption of the incident radiation 128 by the substrate 102 is increased.

The focal point of the incident radiation 128 will change (e.g., move laterally) depending upon an angle of incidence θ of the incident radiation 128. For example, at small angles of incidence θ the micro-lens 126 will focus the incident radiation 128 towards the central diffuser 116, while at larger angles of incidence θ the micro-lens 126 may focus the incident radiation 128 towards one or more of the plurality of peripheral diffusers 118. The central diffuser 116 allows for the substrate 102 to effectively absorb the incident radiation 128 at small angles of incidence, while the plurality of peripheral diffusers 118 allow the substrate 102 to effectively absorb radiation at a large angle of incidence than the central diffuser 116. Therefore, surrounding the central diffuser 116 with the plurality of peripheral diffusers 118 provides the image sensing element 108 with a good quantum efficiency over a wide range of angles of incidence.

Figure 2A:
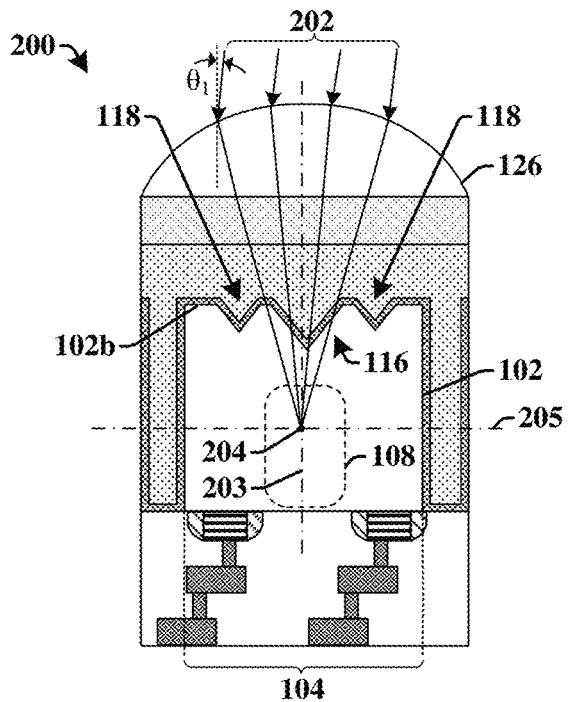
FIGS. 2A-2B illustrate cross-sectional views of some embodiments of disclosed image sensor ICs receiving incident radiation at different angles of incidence.
Figure 2B:
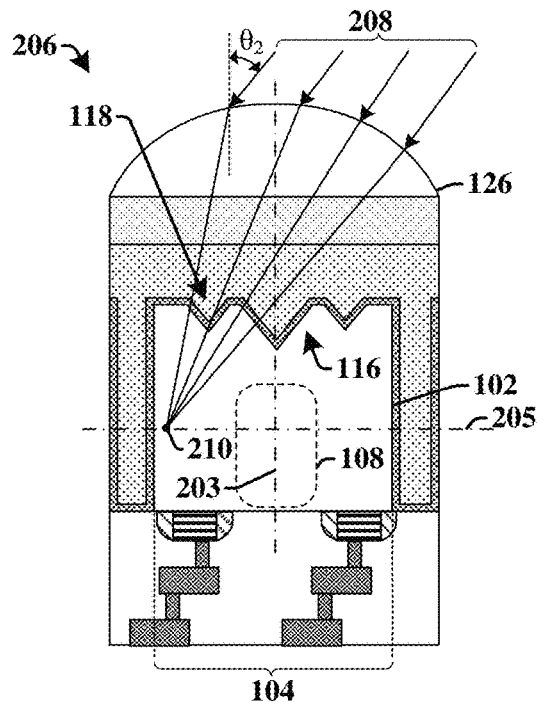
Figure 2C:
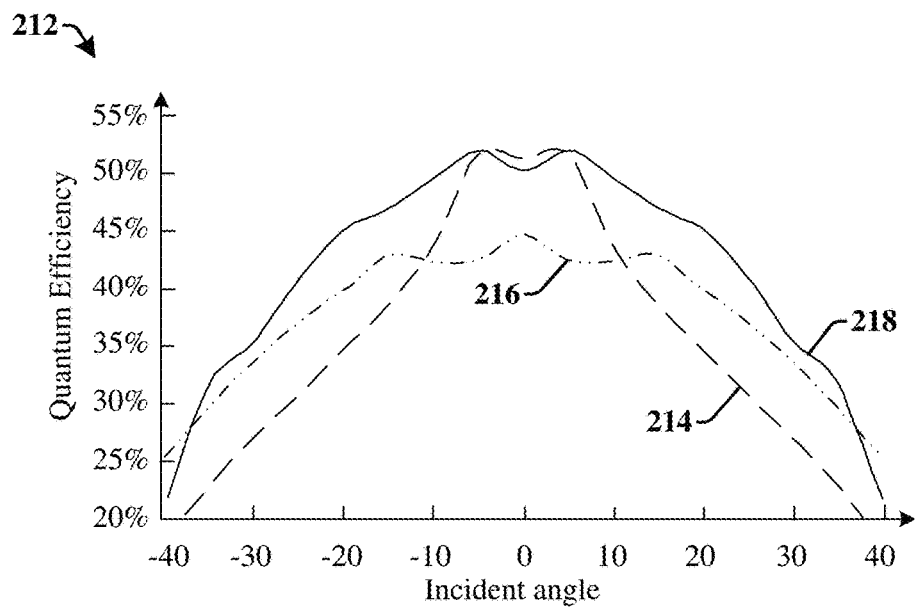
FIG. 2C illustrates a graph showing some embodiments of exemplary quantum efficiencies of a disclosed image sensor IC as a function of angle of incidence.

FIGS. 2A-2C illustrate some embodiments of an exemplary operation of a disclosed image sensor IC receiving incident radiation over a range of angles of incidence. It will be appreciated that the incident radiation shown in FIGS. 2A-2B is illustrated as a simplified ray diagram and is intended to represent an effect of a micro-lens on the incident radiation oriented at different angles. The incident radiation does not illustrate other changes that may occur in the incident radiation (e.g., reflection of the incident radiation at the substrate 102, refraction of the incident radiation at the substrate 102, etc.).

FIG. 2A illustrates a cross-sectional view 200 of some embodiments of a disclosed image sensor IC receiving incident radiation at a first angle of incidence.

As shown in cross-sectional view 200, the image sensor IC comprises an image sensing element 108 disposed within a pixel region 104 of a substrate 102. A central diffuser 116 and a plurality of peripheral diffusers 118 are disposed along a back-side 102b of the substrate 102. A micro-lens 126 is also disposed on the back-side 102b of the substrate 102.

The micro-lens 126 receives incident radiation 202 at a first angle of incidence $\theta_1$ (measured with respect to an optical axis 203) and focuses the incident radiation 202 towards a first point 204 within a central part of the pixel region 104. If the first angle of incidence $\theta_1$ is greater than 0° (i.e., if the incident radiation 202 is not parallel to the optical axis 203), the first point 204 will be disposed on a focal plane 205 at a point that is laterally separated from the optical axis 203. Because the first point 204 is within a central part of the pixel region 104, a large amount of the incident radiation 202 is received by the central diffuser 116. Therefore, the central diffuser 116 is able to provide the image sensing element 108 with a good quantum efficiency when incident radiation 202 is received at the first angle of incidence $\theta_1$.

FIG. 2B illustrates a cross-sectional view 206 of some embodiments of a disclosed image sensor IC receiving incident radiation at a second angle of incidence that is larger than the first angle of incidence.

As shown in cross-sectional view 206, the micro-lens 126 receives incident radiation 208 at a second angle of incidence $\theta_2$ that is larger than the first angle of incidence ($\theta_1$ of FIG. 2A). The micro-lens 126 focuses the incident radiation 208 towards a second point 210. Because the second angle of incidence $\theta_2$ is greater than the first angle of incidence $\theta_1$ the second point 210 is disposed on the focal plane 205 at a larger distance from the optical axis 203 than the first point (204 of FIG. 2A), thereby resulting in the second point 210 being closer to an edge of the pixel region 104 than the first point (204 of FIG. 2A)). Because the second point 210 is closer to an edge of the pixel region 104 than the first point (204 of FIG. 2A), more of the incident radiation 208 is received by the plurality of peripheral diffusers 118 than by the central diffuser 116. Therefore, the plurality of peripheral diffusers 118 are able to provide the image sensing element 108 with a good quantum efficiency when incident radiation 208 is received at a second angle of incidence $\theta_2$ that is larger than the first angle of incidence $\theta_1$.

FIG. 2C illustrates a graph 212 showing some embodiments of exemplary quantum efficiencies of a disclosed image sensor IC as a function of an angle of incidence of incident radiation.

As shown in graph 212, an image sensor IC having a large central diffuser at a center of a pixel region will have a quantum efficiency 214 shown by a first line, while an image sensor IC having an array of smaller diffusers over a pixel region will have a quantum efficiency 216 shown by a second line. Within an angle of incidence that is between approximately −10° and approximately 10°, the quantum efficiency 214 provided by the large central diffuser is greater than the quantum efficiency 216 provided by the array of smaller diffusers, while at an angle of incidence that is larger than approximately 10° and that is less than approximately −10°, the quantum efficiency 216 provided by the array of smaller diffusers is greater than the quantum efficiency 216 provided by the large central diffuser.

Line 218 shows a quantum efficiency of an image sensor IC having pixel region with a large central diffuser that is surrounded by a plurality of peripheral diffusers (e.g., as shown in FIG. 2A). The large central diffuser allows the image sensor IC to absorb incident radiation at small angles of incidence with a good quantum efficiency. In some embodiments, a quantum efficiency of the image sensor IC has a maximum value of greater than approximately 50% at an angle of incidence in a range of between approximately −10° and approximately 10°. Furthermore, the plurality of peripheral diffusers also allow the image sensor IC to absorb incident radiation at large angles of incidence with a good quantum efficiency. For example, as shown in line 218, the image sensor IC may have a quantum efficiency that is greater than approximately 45% for incident radiation having an angle of incidence that is between approximately −20° and approximately 20°. Accordingly, the disclosed image sensor IC is able to provide for a good quantum efficiency over a broad range of angles of incidence.

It will be appreciated that in addition to providing a good quantum efficiency over a broad range of incident angles, the disclosed different sized diffusers are also able to provide for a good quantum efficiency to image sensor ICs having micro-lenses with different f-numbers (i.e., a ratio of a micro-lens's focal length to a diameter of the micro-lens) and/or to a micro-lens having an adjustable f-number. This is because the f-number of a micro-lens will affect how incident radiation is focused onto a pixel region of a semiconductor structure.

Figures 3A, 3B:
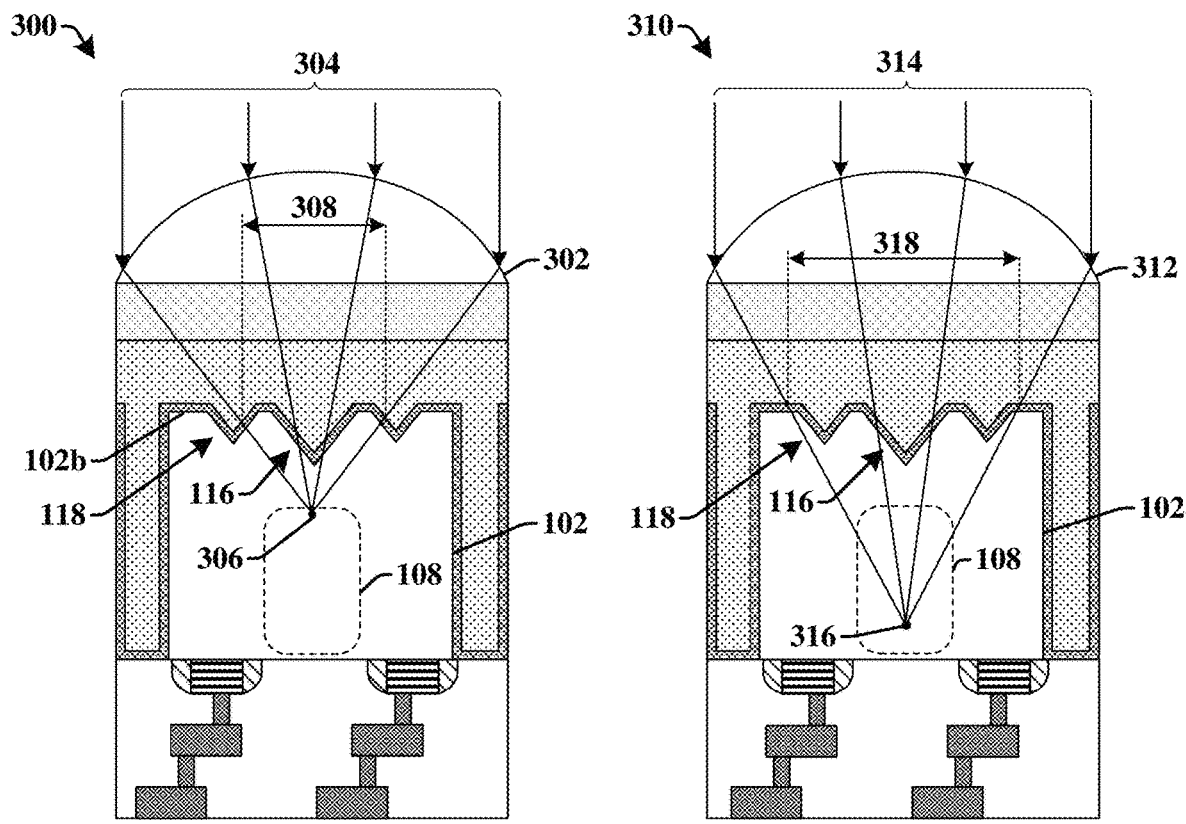
FIGS. 3A-3B illustrate cross-sectional views of some embodiments of disclosed image sensor ICs having micro-lenses with different f-numbers.

FIGS. 3A-3B illustrate cross-sectional views of some embodiments of disclosed image sensor ICs having micro-lenses with different f-numbers (i.e., f-ratios). It will be appreciated that the incident radiation shown in FIGS. 3A-3B is illustrated as a simplified ray diagram and is intended to represent an effect of a micro-lenses having different f-numbers on the incident radiation. The incident radiation does not illustrate other changes that may occur in the incident radiation (e.g., reflection of the incident radiation at the substrate 102, refraction of the incident radiation at the substrate 102, etc.).

As shown in cross-sectional view 300 of FIG. 3A, a first micro-lens 302 having a first f-number is disposed along a back-side 102b of a substrate 102 having an image sensing element 108. The first f-number is defined by a first focal length and a first diameter of the first micro-lens 302. The first micro-lens 302 receives incident radiation 304 and focuses the incident radiation 304 towards a first focal point 306 within a central part of a pixel region 104.

The curved surface of the micro-lens 126 will change a direction of incident radiation 304 to an angle that is proportional to a lateral distance from a center of the micro-lens 126. Therefore, the first micro-lens 302 having the first f-number will cause the incident radiation 304 to be focused over a first range of angles that cause the incident radiation 304 to converge to a first area 308 that causes a large amount of the incident radiation 202 to be received by the central diffuser 116. Accordingly, the central diffuser 116 is able to provide the image sensing element 108 with a good quantum efficiency when the first micro-lens 302 has a first f-number.

As shown in cross-sectional view 310 of FIG. 3B, a second micro-lens 312 has a second f-number that is smaller than the first f-number. The second micro-lens 312 receives incident radiation 314 and focuses the incident radiation 314 towards a second focal point 316 within a central part of the pixel region 104. Because the second f-number is smaller than the first f-number, the incident radiation 314 will be focused over a second range of angles that cause the incident radiation 314 to converge to second area 318 that is larger than the first area (308 of FIG. 3A). Since the second area 318 is larger than the first area, a large amount of the incident radiation 202 is received by the plurality of peripheral diffusers 118. Therefore, the plurality of peripheral diffusers 118 are able to provide the image sensing element 108 with a good quantum efficiency when the second micro-lens 312 has a second f-number that is smaller than the first f-number.

Figure 3C:
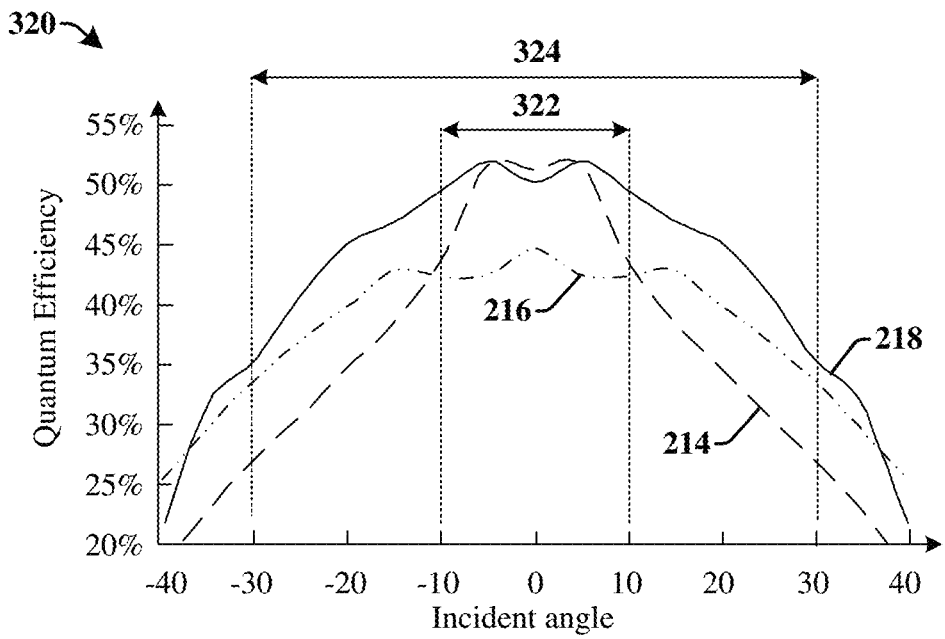
FIG. 3C illustrates a graph showing some embodiments of exemplary quantum efficiencies of micro-lenses with different f-numbers.

FIG. 3C illustrates a graph 320 showing a quantum efficiency as a function of angle of incidence. As shown in graph 320, an image sensor IC having a large central diffuser at a center of a pixel region will have a quantum efficiency 214 shown by a first line, while an image sensor IC having an array of smaller diffusers over a pixel region will have a quantum efficiency 216 shown by a second line. Line 218 shows a quantum efficiency of an image sensor IC having pixel region with a large central diffuser that is surrounded by a plurality of peripheral diffusers (e.g., as shown in FIG. 3A).

As also shown by graph 320, incident radiation focused by the first micro-lens (e.g., 302) into the first area (e.g., 308) will span a first range of incidence angles 322, while incident radiation focused by the second micro-lens (e.g., 312) into the second area (e.g., 318) will span a second range of incidence angles 324 that is larger than the first range of incidence angles 322. In some embodiments, the first range of incidence angles 322 may be between approximately −10° and approximately 10°, while the second range of incidence angles 324 may be between approximately −30° and approximately 30°. Because the central diffuser is able to provide for a good quantum efficiency at angles of incidence between approximately −10° and approximately 10°, the disclosed image sensor IC is able to provide for a good quantum efficiency for micro-lenses having a large f-number (e.g., an f-number of approximately f/3 or above). Furthermore, because the plurality of peripheral diffusers 118 are able to provide for a good quantum efficiency at larger angles of incidence, the disclosed image sensor IC is also able to provide for a good quantum efficiency for micro-lenses having smaller f-numbers (e.g., an f-number of approximately f/0.9 or above). For example, in some embodiments, the different sized diffusers may provide an image sensor IC a quantum efficiency of greater than approximately 35% for near infrared radiation with micro-lenses having f-numbers greater than approximately f/0.9.

Figure 4A:
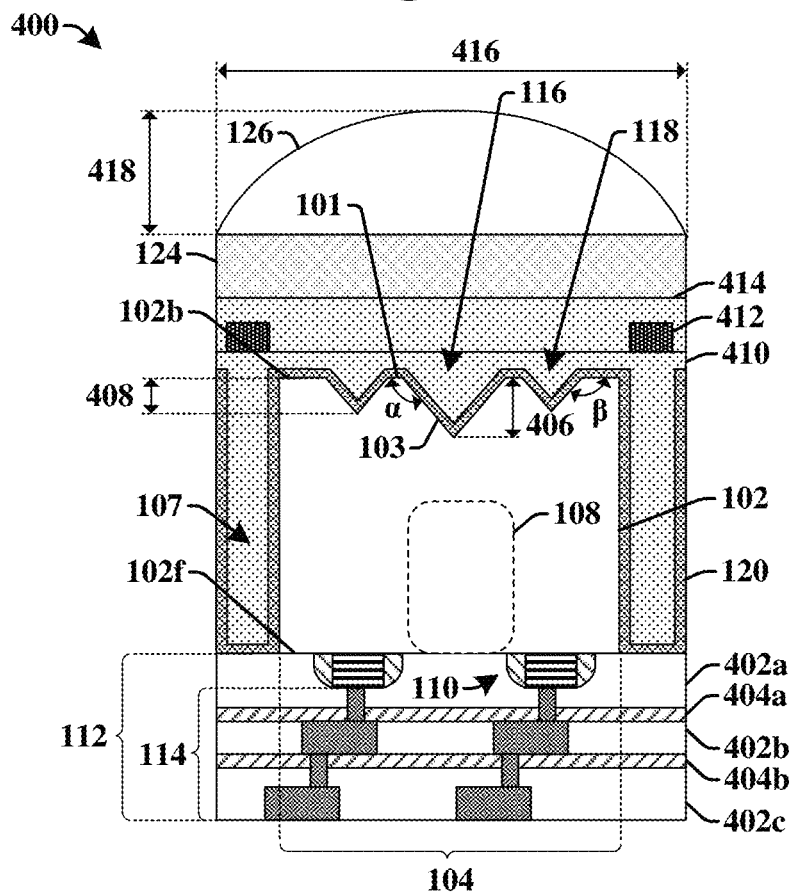
FIGS. 4A-4B illustrate some additional embodiments of an image sensor IC having different sized diffusers configured to provide a good quantum efficiency to an image sensor.

FIG. 4A illustrates a cross-sectional view of some additional embodiments of an image sensor IC 400 having different sized diffusers.

The image sensor IC 400 comprises an image sensing element 108 disposed within a pixel region 104 of a substrate 102. A plurality of conductive interconnect layers 114 are disposed within a dielectric structure 112 arranged along a front-side 102f of the substrate 102. In some embodiments, the dielectric structure 112 comprises a plurality of stacked inter-level dielectric (ILD) layers 402a-402c. The plurality of conductive interconnect layers 114 comprise alternating layers of conductive vias and conductive wires, which are arranged within the plurality of stacked ILD layers 402a-402c and electrically coupled to a plurality of gate structures 110. In some embodiments, etch stop layers 404a-404b may be arranged between adjacent ones of the plurality of stacked ILD layers 402a-402c. In various embodiments, the plurality of stacked ILD layers 402a-402c may comprise one or more of silicon dioxide, doped silicon dioxide (e.g., carbon doped silicon dioxide), silicon oxynitride, borosilicate glass (BSG), phosphoric silicate glass (PSG), borophosphosilicate glass (BPSG), fluorinated silicate glass (FSG), or the like. In some embodiments, the etch stop layers 404a-404b may comprise silicon carbide, silicon nitride, titanium nitride, tantalum nitride, or the like. In some embodiments, the plurality of conductive interconnect layers 114 may comprise tungsten, copper, aluminum, or the like.

A back-side 102b of the substrate 102 comprises angled surfaces 103 within the pixel region 104. The angled surfaces 103 define a central diffuser 116 surrounded by a plurality of peripheral diffusers 118. In some embodiments, the central diffuser 116 has a first maximum depth 406 and the plurality of peripheral diffusers 118 have one or more second maximum depths 408 that are smaller than the first maximum depth 406. In some embodiments, the substrate 102 comprises a substantially flat surface 101 between the central diffuser 116 and the plurality of peripheral diffusers 118. In other embodiments, the central diffuser 116 may directly contact the plurality of peripheral diffusers 118, so that no distance separates the central diffuser 116 and the plurality of peripheral diffusers 118.

In some embodiments, first maximum depth 406 may be between approximately 100% and approximately 250% of the one or more second maximum depths 408. In some embodiments, the first maximum depth 406 may be in a range of between approximately 0.5 μm and approximately 0.7 μm, between approximately 0.7 μm and approximately 1.2 μm, or other suitable values. In some embodiments, the one or more second maximum depths 408 may be in a range of between approximately 0.3 μm and approximately 0.5 μm, between approximately 0.5 μm and approximately 1 μm, or other suitable values In some embodiment, the angled surfaces 103 of the substrate 102 defining the central diffuser 116 may form a first angle α with respect to the back-side 102b of the substrate 102. In some embodiment, the angled surfaces 103 of the substrate 102 defining the plurality of peripheral diffusers 118 may form a second angle β with respect to the back-side 102b of the substrate 102. In some embodiments, the first angle α is substantially equal to the second angle β. In some embodiments, the first angle α and the second angle β may be in a range of between approximately 135° and approximately 145°. In other embodiments, the first angle α may be different than the second angle β.

One or more isolation trenches 107 extend into the substrate 102 from a back-side 102b of the substrate 102. The one or more isolation trenches 107 extend into the substrate 102 to a third maximum depth that is greater than both the first maximum depth 406 and the one or more second maximum depths 408. In some embodiments, the one or more isolation trenches 107 may extend completely through the substrate 102. In some embodiments, the one or more isolation trenches 107 have sidewalls that are angled at a smaller sidewall angle with respect to the back-side 102b of the substrate 102 than the angled surfaces 103. In some such embodiments, the one or more isolation trenches 107 may have a trapezoidal shape, as viewed along a cross-sectional view. In some embodiments, a substantially flat surface may extend between the plurality of peripheral diffusers 118 and the one or more isolation trenches 107.

An anti-reflective material 120 is disposed along the back-side 102b of the substrate 102 and may further extend to within the one or more isolation trenches 107. In some embodiments, the anti-reflective material 120 may comprise a high-k dielectric material. A first dielectric layer 410 is arranged over the anti-reflective material 120. The first dielectric layer 410 extends within the one or more isolation trenches 107 to define isolation structures (e.g., back-side deep trench isolation structure) on opposing sides of the pixel region 104. In some embodiment, the first dielectric layer 410 can include an oxide (e.g., silicon oxide), a nitride (e.g., silicon nitride), or the like.

In some embodiments, one or more grid elements 412 are disposed over the first dielectric layer 410. The one or more grid elements 412 are configured to reduce cross-talk between adjacent pixel regions by blocking the lateral propagation of radiation. In some embodiment, the one or more grid elements 412 may comprise a metal (e.g., aluminum, cobalt, copper, silver, gold, tungsten, etc.) and/or a dielectric material (e.g., $SiO_2$, SiN, etc.).

A second dielectric layer 414 is disposed over the first dielectric layer 410 and the one or more grid elements 412. In some embodiments, the second dielectric layer 414 may comprise an oxide (e.g., silicon oxide), a nitride (e.g., silicon nitride), or the like. In some embodiments, the first dielectric layer 410 and the second dielectric layer 414 are a same material. In other embodiments, the first dielectric layer 410 and the second dielectric layer 414 may comprise different materials. A color filter 124 is arranged on the second dielectric layer 414 and a micro-lens 126 is arranged on the color filter 124. In some embodiments, the micro-lens 126 may have a length and a width 416 that are in a range of between approximately 2 μm and approximately 3 μm, between approximately 1.5 μm and approximately 2 μm, or other suitable values. In some embodiments, the micro-lens 126 may have a height 418 that is in a range of between approximately 1 μm and approximately 1.5 μm, between approximately 0.5 μm and approximately 1 μm, or other suitable values.

Figure 4B:
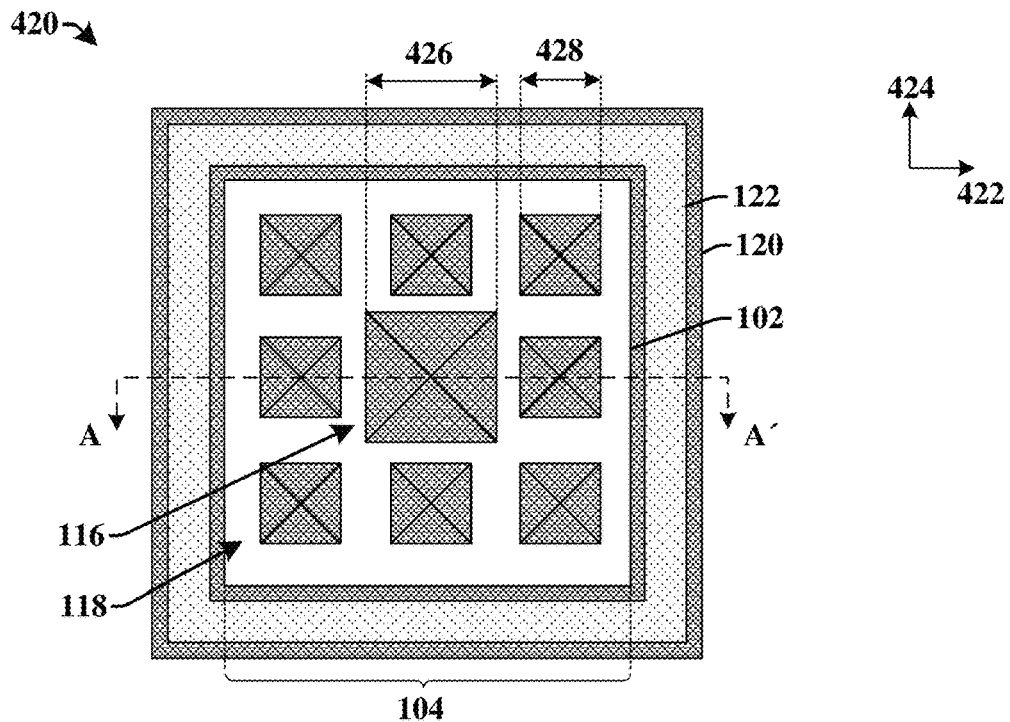

FIG. 4B illustrates a top-view 420 of the image sensor IC 400 of FIG. 4A. The cross-sectional view of FIG. 4A is taken along cross-sectional view A-A' of FIG. 4B.

As shown in top-view 420, the plurality of peripheral diffusers 118 are arranged between the central diffuser 116 and perimeter of the pixel region 104, so that the central diffuser 116 is closer to a center of the pixel region 104 than the plurality of peripheral diffusers 118. In some embodiments, the plurality of peripheral diffusers 118 may be arranged along opposing sides of the central diffuser 116 along a first direction 422 and/or along a second direction 424 that is perpendicular to the first direction 422. In some embodiments, the plurality of peripheral diffusers 118 may be substantially symmetric around a center of the central diffuser 116. In other embodiments (not shown), the plurality of peripheral diffusers 118 may be asymmetric around the center of the central diffuser 116. In some embodiments, the central diffuser 116 laterally extends past opposing sides of a first one of the plurality of peripheral diffusers 118 along the first direction 422 and laterally extends past opposing sides of a second one of the plurality of peripheral diffusers 118 along the second direction 424.

In some embodiments, the central diffuser 116 is arranged over a center of a pixel region 104. In some additional embodiments, the central diffuser 116 may be substantially centered over the pixel region 104. In some embodiments, the central diffuser 116 and the plurality of peripheral diffusers 118 may comprise pyramidal shaped cavities (e.g., a square pyramid, a rectangular pyramid, a triangular pyramid). In other embodiments (not shown), the central diffuser 116 and the plurality of peripheral diffusers 118 may comprise a conical shaped cavity, a bowl shaped cavity, or the like. In some embodiments, the central diffuser 116 is defined by one or more first angled surfaces that meet at a point that is at a bottom of the central diffuser 116 and the plurality of peripheral diffusers 118 are defined by one or more second angled surfaces that meet at a point that is at a bottom of one of the plurality of peripheral diffusers 118.

The central diffuser 116 has a first maximum width 426. The plurality of peripheral diffusers 118 have a second maximum width 428 that is smaller than the first maximum width 426. In some embodiments, first maximum width 426 may be between 100% and approximately 250% of the second maximum width 428. For example, in some embodiments, the first maximum width 426 may be in a range of between approximately 1 μm and approximately 1.5 μm, between approximately 1.5 μm and approximately 2.5 μm, or other suitable values. In some embodiments, the second maximum width 428 may have a depth that is in a range of between approximately 0.5 μm and approximately 1 μm, between approximately 1 μm and approximately 2 μm, or other suitable values.

Although FIGS. 4A-4B illustrate a single pixel region, it will be appreciated that the pixel region shown in FIGS. 4A-4B may be part of an array comprising a plurality of pixel regions. In some embodiments, such an array of pixels may have micro-lenses with a same f-number. In other embodiments, such an array of pixels may have micro-lenses with different f-numbers.

Figure 5A:
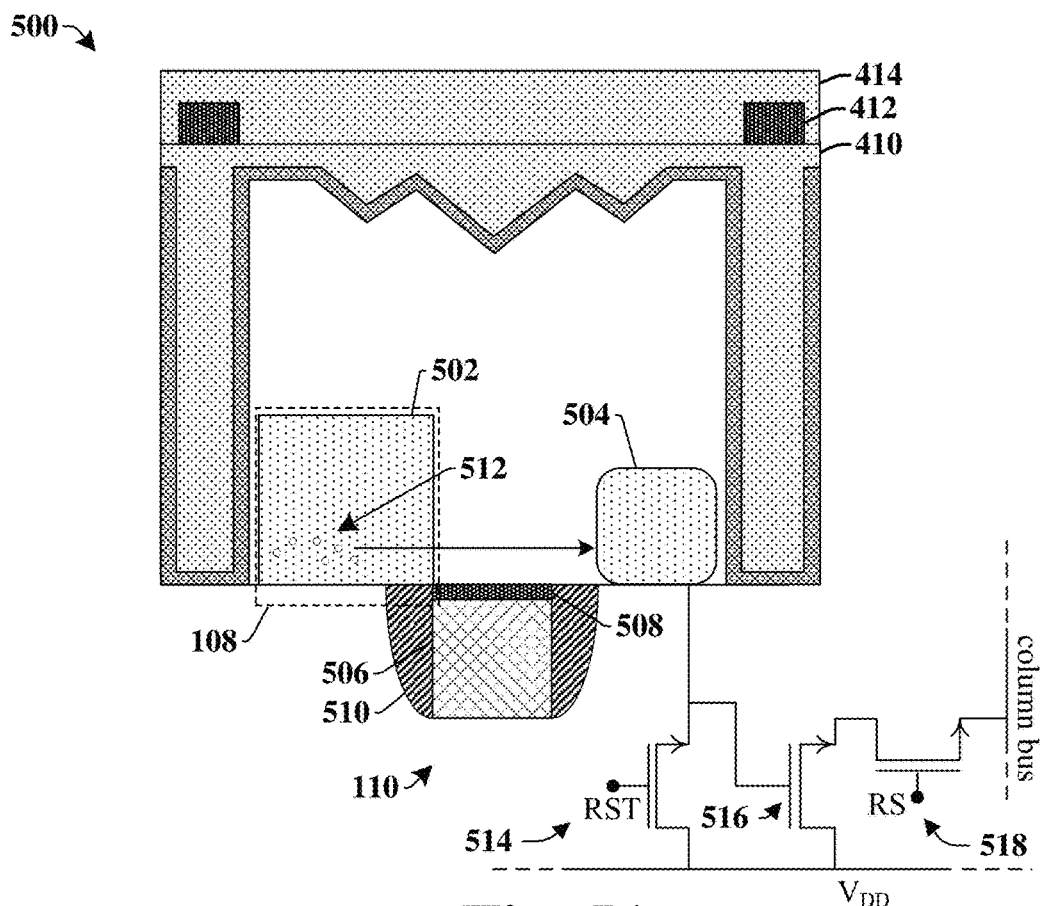
FIGS. 5A-5B illustrate some more detailed embodiments of an image sensor IC having different sized diffusers configured to provide a good quantum efficiency to an image sensor.

FIG. 5A illustrates some additional embodiments of a cross-sectional view of an image sensor IC 500 having different sized diffusers.

The image sensor IC 500 comprises an image sensing element 108 disposed within a substrate 102. In some embodiments, the substrate 102 may have a first doping type (e.g., a p-type doping). In some embodiments, the image sensing element 108 comprises a photodiode having a doped region 502 with a second doping type (e.g., an n-type doping). The image sensing element 108 is laterally separated from a floating diffusion region 504 arranged within the substrate 102. In some embodiments, the floating diffusion region 504 may have the second doping type (e.g., the n-type doping).

A gate structure 110 is disposed over the substrate 102 at a location between the image sensing element 108 and the floating diffusion region 504. The gate structure 110 comprises a conductive gate electrode 506 separated from the substrate 102 by a gate dielectric 508. In some embodiments, one or more sidewall spacers 510 are arranged along opposing sides of the conductive gate electrode 506.

In some embodiments, the conductive gate electrode 506 comprises polysilicon. In such embodiments, the gate dielectric 508 may include a dielectric material, such as an oxide (e.g., silicon dioxide), a nitride (e.g., silicon-nitride), or the like. In other embodiments, the conductive gate electrode 506 may comprise a metal, such as aluminum, copper, titanium, tantalum, tungsten, molybdenum, cobalt, or the like. In such embodiments, the gate dielectric 508 may comprise a high-k dielectric material, such as hafnium oxide, hafnium silicon oxide, hafnium tantalum oxide, aluminum oxide, zirconium oxide, or the like. In some embodiments, the one or more sidewall spacers 510 may comprise an oxide, a nitride, a carbide, or the like.

During operation, electromagnetic radiation (e.g., photons) striking the image sensing element 108 generates charge carriers 512, which are collected in the doped region 502. When the gate structure 110 (which is configured to operate as a transfer transistor) is turned on, the charge carriers 512 in the doped region 502 are transferred to the floating diffusion region 504 as a result of a potential difference existing between the doped region 502 and the floating diffusion region 504. The charges are converted to voltage signals by a source-follower transistor 516. A row select transistor 518 is used for addressing. Prior to charge transfer, the floating diffusion region 504 is set to a predetermined low charge state by turning on a reset transistor 514, which causes electrons in the floating diffusion region 504 to flow into a voltage source (VDD). Although the pixel region of FIG. 5A is described as having a transfer transistor disposed within the substrate 102 it will be appreciated that reset transistor 514, the source-follower transistor 516, and the row select transistor 518 may also be arranged within the substrate 102.

Figure 5B:
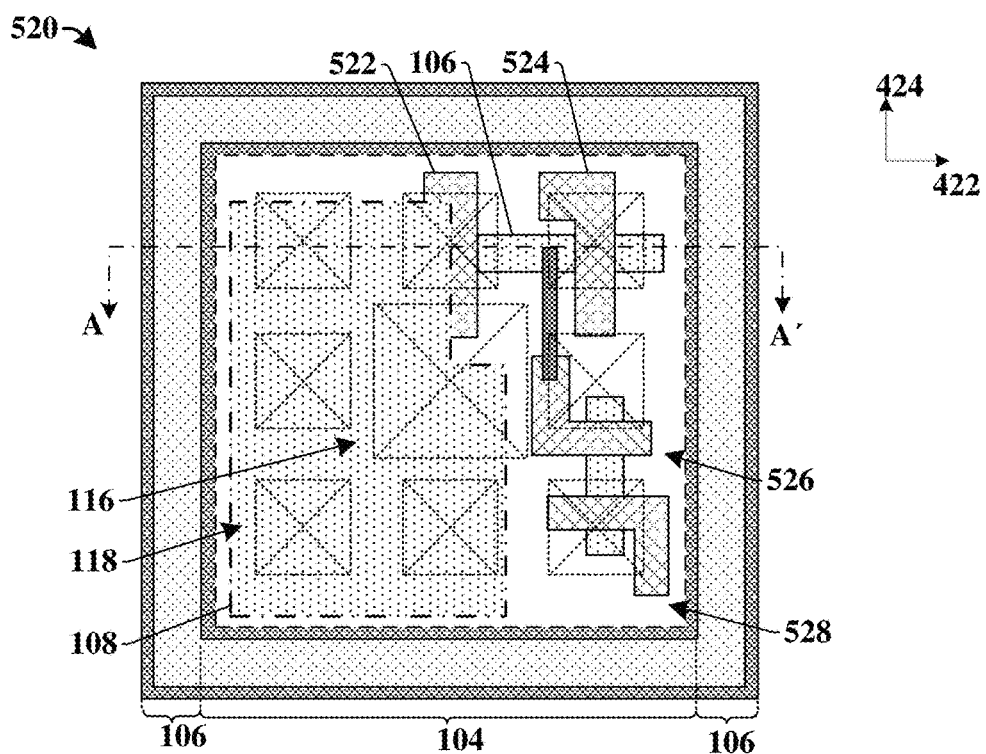

FIG. 5B illustrates a top-view 520 of some embodiments of the image sensor IC 500 of FIG. 5A. It will be appreciated that top-view 520 shows selected components of the image sensor IC 500 while excluding other components to clarify the figure.

As shown in top-view 520, an isolation region 106 extends around the pixel region 104 as a continuous structure. The pixel region 104 comprises a first gate structure 522 associated with the transfer transistor, a second gate structure 524 associated with the reset transistor, a third gate structure 526 associated with a source-follower transistor, and a fourth gate structure 528 associated with a row select transistor. The image sensing element 108 extends to over a center of the pixel region 104. A central diffuser 116 is disposed over the image sensing element 108. One or more of a plurality of peripheral diffusers 118 are also arranged over the image sensing element 108.

Figure 6:
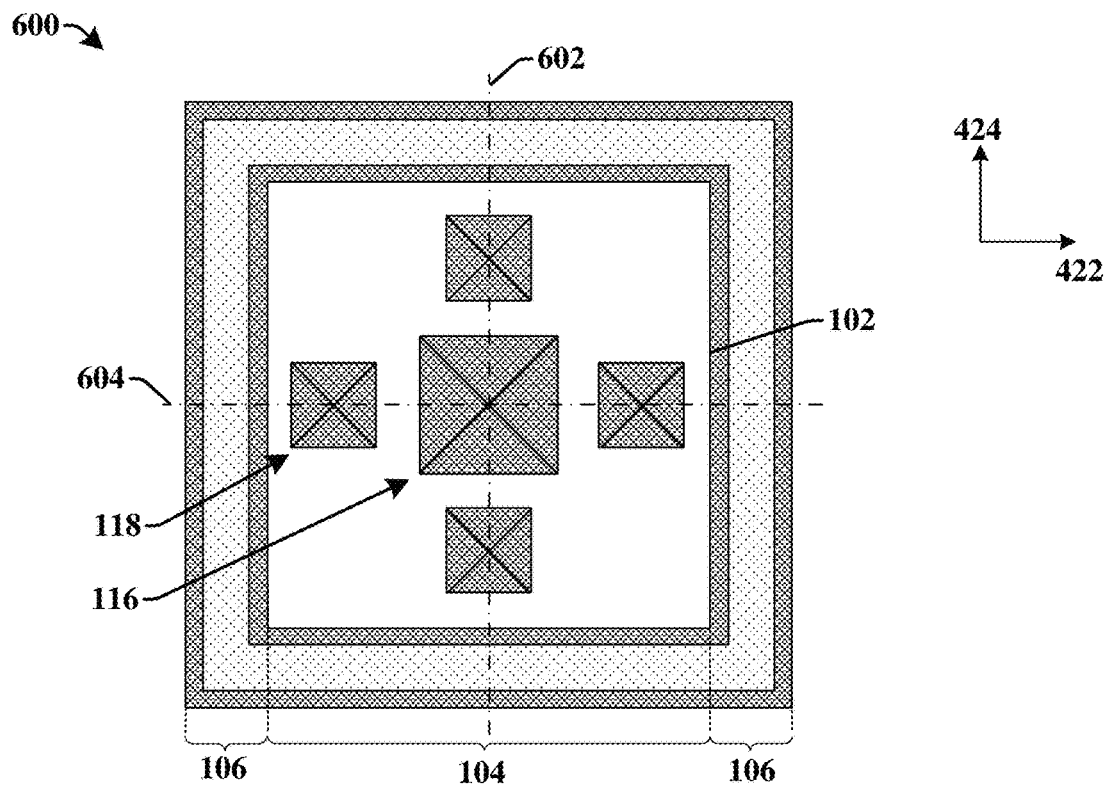
FIGS. 6-7 illustrate top-views of some additional embodiments of image sensor ICs having different sized diffusers configured to provide a good quantum efficiency to an image sensor.

FIG. 6 illustrates a top-view of some additional embodiments of an image sensor IC 600 having different sized diffusers.

The image sensor IC 600 comprises a central diffuser 116 laterally surrounded by a plurality of peripheral diffusers 118. In some embodiments, the central diffuser 116 is substantially centered within a pixel region 104. In some embodiments, one or more of the plurality of peripheral diffusers 118 are arranged along a first line 602 that bisects the central diffuser 116, and one or more of the plurality of peripheral diffusers 118 are arranged along a second line 604 that is perpendicular to the first line 602 and that bisects the central diffuser 116. In some embodiments, the first line 602 bisects a first pair of opposing sides of the central diffuser 116 and the second line 604 bisects a second pair of opposing sides of the central diffuser 116 that is different than the first pair of opposing sides of the central diffuser 116.

Figure 7:
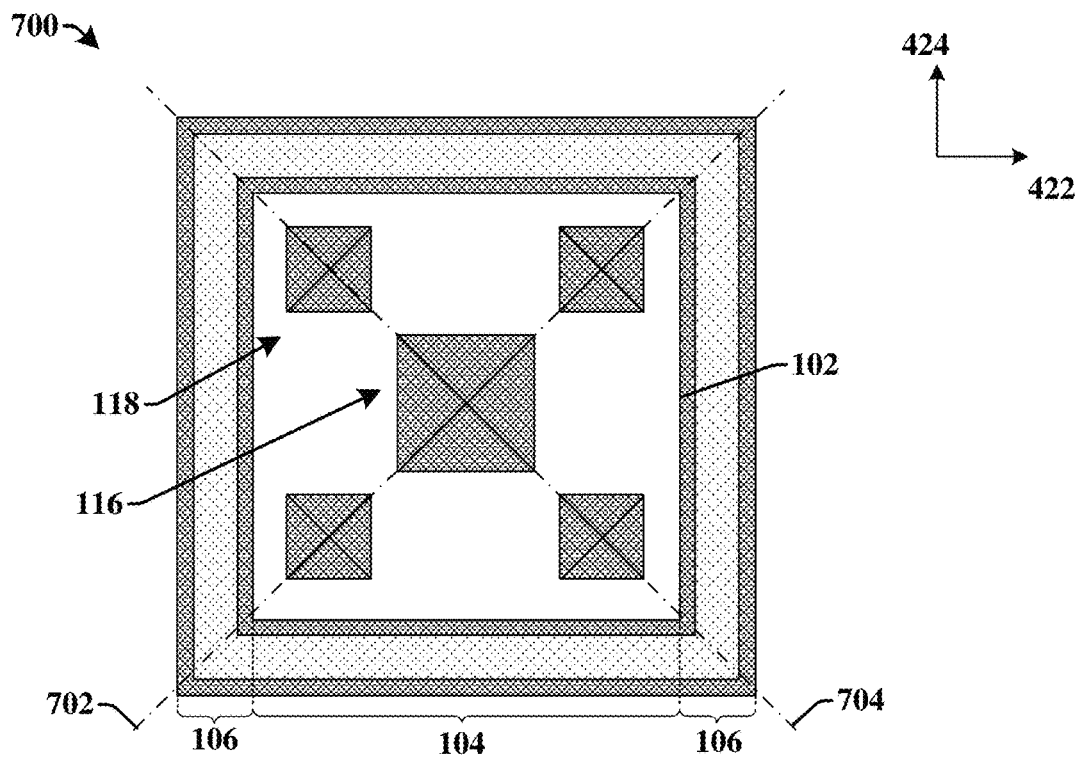

FIG. 7 illustrates a top-view of some additional embodiments of an image sensor IC 700 having different diffusers.

The image sensor IC 700 comprises a central diffuser 116 laterally surrounded by a plurality of peripheral diffusers 118. In some embodiments, the central diffuser 116 is substantially centered within a pixel region 104. In some embodiments, one or more of the plurality of peripheral diffusers 118 are arranged along a third line 702 that bisects the central diffuser 116, and one or more of the plurality of peripheral diffusers 118 are arranged along a fourth line 704 that is perpendicular to the third line 702 and that bisects the central diffuser 116. In some embodiments, the third line 702 extends through a first pair of corners of the central diffuser 116 and the fourth line 704 bisects a second pair of corners of the central diffuser 116 that is different than the first pair of corners of the central diffuser 116.

Although FIGS. 6-7 illustrate semiconductor structures having a single large cavity within a pixel region, it will be appreciated that in some alternative embodiments the disclosed semiconductor structure may have multiple large cavities within a pixel region. For example, FIG. 8A illustrate a cross-sectional view of some additional embodiments of an image sensor IC 800 having different sized diffusers.

The image sensor IC 800 comprises a pixel region 104 surrounded by an isolation region 106. A plurality of central diffusers 802 are disposed within a central section of the pixel region 104. The plurality of central diffusers 802 are surrounded by a plurality of peripheral diffusers 118 disposed within a peripheral section of the pixel region 104. The plurality of central diffusers 802 respectively have a first maximum depth and a first maximum width. The plurality of peripheral diffusers 118 respectively have a second maximum depth that is less than the first maximum depth and a second maximum width that is less than the first maximum width.

Figure 8A:
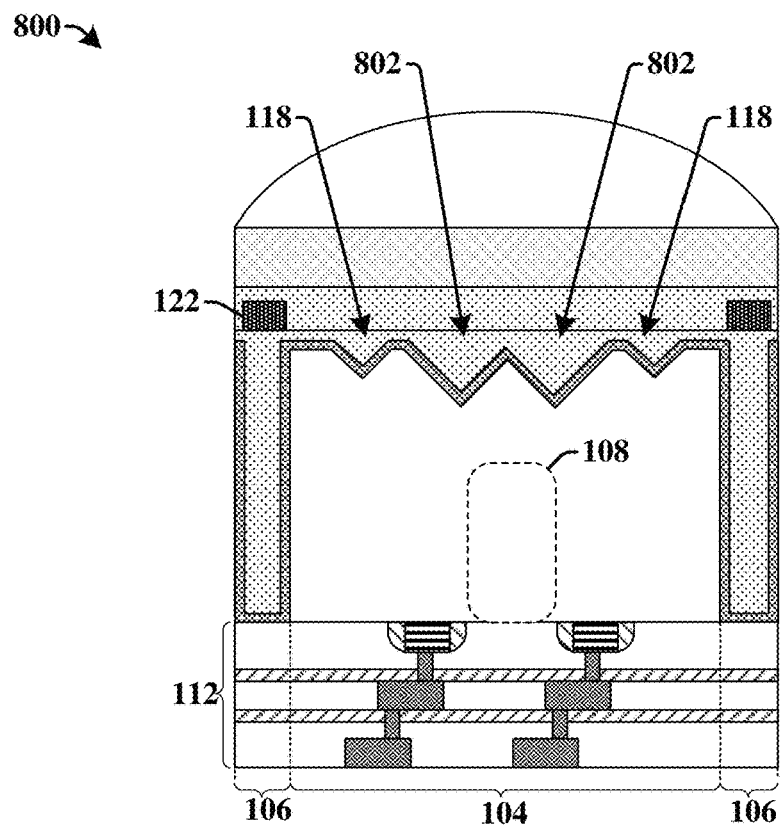
FIGS. 8A-8B illustrate some additional embodiments of an image sensor IC having different sized diffusers configured to provide a good quantum efficiency to an image sensor.
Figure 8B:
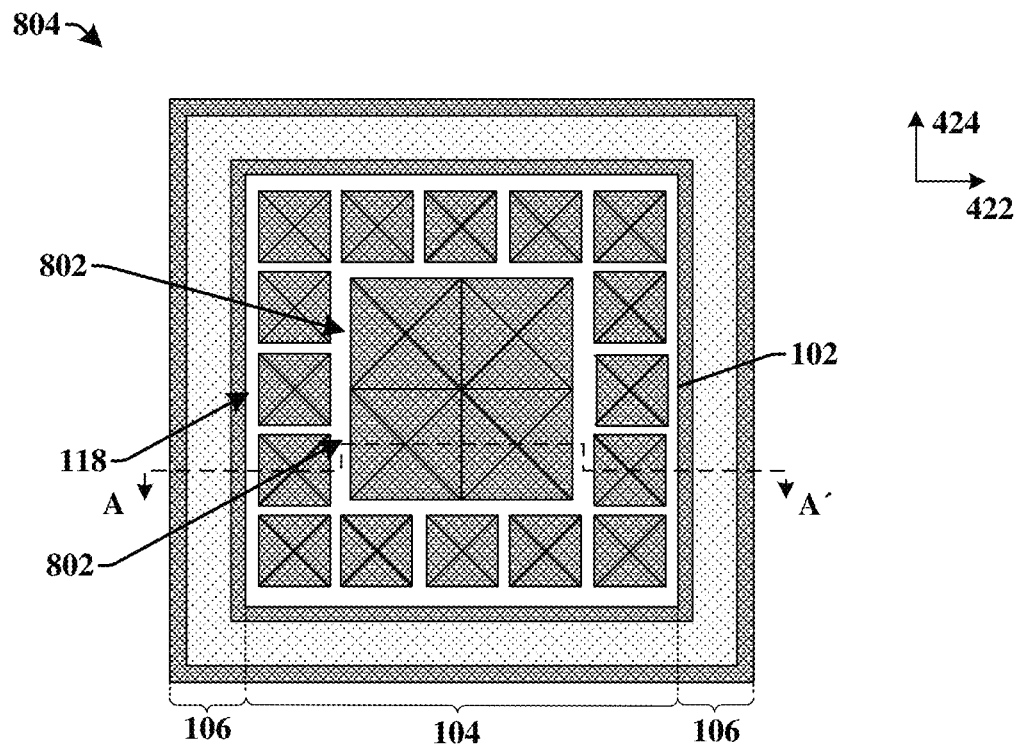

FIG. 8B illustrates some embodiments of a top-view 804 of the image sensor IC 800 of FIG. 8A. The cross-sectional view of FIG. 8A is taken along cross-sectional view A-A' of FIG. 8B.

FIGS. 9-20 illustrate cross-sectional views 900-1900 of some embodiments of a method of forming an image sensor IC, in accordance with example embodiments of the disclosure. Although FIGS. 9-20 are described with reference to a method, it will be appreciated that the structures shown in FIGS. 9-20 are not limited to the method but rather may stand alone separate of the method.

Figure 9:
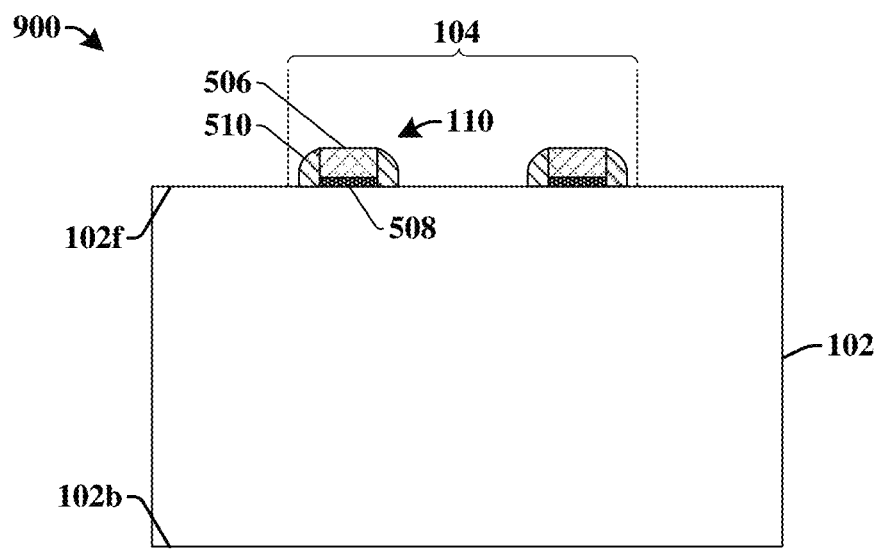

As shown in cross-sectional view 900 of FIG. 9, a substrate 102 is provided. The substrate 102 comprises a front-side 102*f* and a back-side 102*b*. The substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith.

One or more gate structures 110 are formed along the front-side 102*f* of the substrate 102 within a pixel region 104. In various embodiments, the one or more gate structures 110 may correspond to a transfer transistor, a source-follower transistor, a row select transistor, and/or a reset transistor. In some embodiments, the one or more gate structures 110 may be formed by depositing a gate dielectric film and a gate electrode film on the front-side 102*f* of the substrate 102. The gate dielectric film and the gate electrode film are subsequently patterned to form a gate dielectric 508 and a conductive gate electrode 506 over the gate dielectric 508. One or more sidewall spacers 510 may be formed along opposing sidewalls of the conductive gate electrode 506. In some embodiments, the one or more sidewall spacers 510 may be formed by depositing a spacer layer (e.g., a nitride, an oxide, etc.) onto the front-side 102*f* of the substrate 102 and selectively etching the spacer layer to form the one or more sidewall spacers 510.

Figure 10:
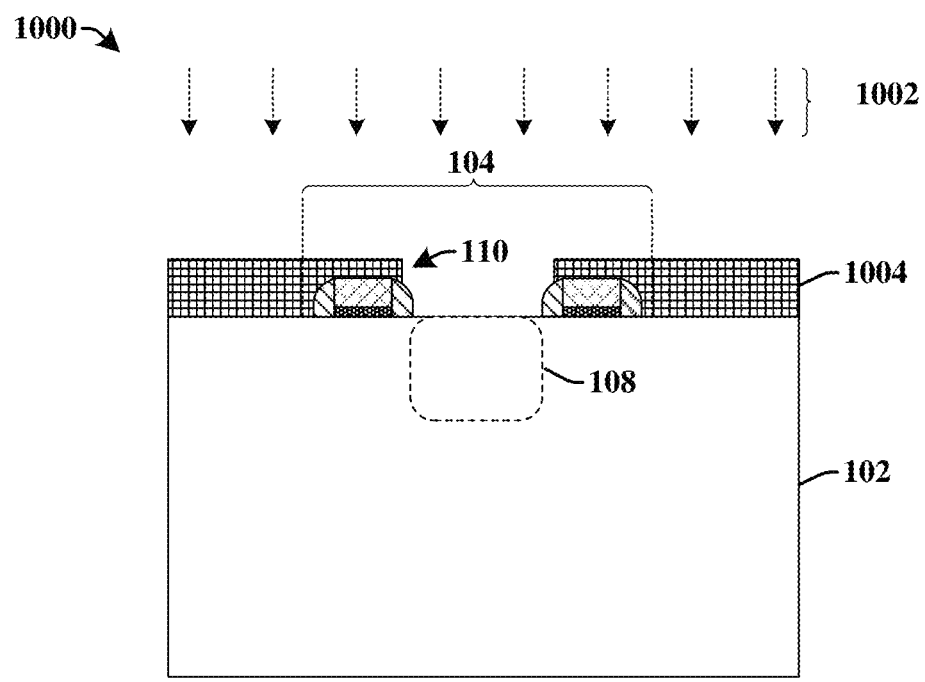

As shown in cross-sectional view 1000 of FIG. 10, an image sensing element 108 is formed within the pixel region 104 of the substrate 102. In some embodiments, the image sensing element 108 may comprise a photodiode formed by selectively implanting one or more dopant species 1002 into the front-side 102f of the substrate 102. For example, the photodiode may be formed by performing a first implantation process that implants the one or more dopant species 1002 into the substrate 102 according to a first masking layer 1004 to form a first region having a first doping type (e.g., n-type). In some embodiments, a second implantation process may be subsequently performed to form a second region abutting the first region and having a second doping type (e.g., p-type) different than the first doping type. In some embodiments a floating diffusion well (not shown) may also be formed using one of the first or second implantation processes.

Figure 11:
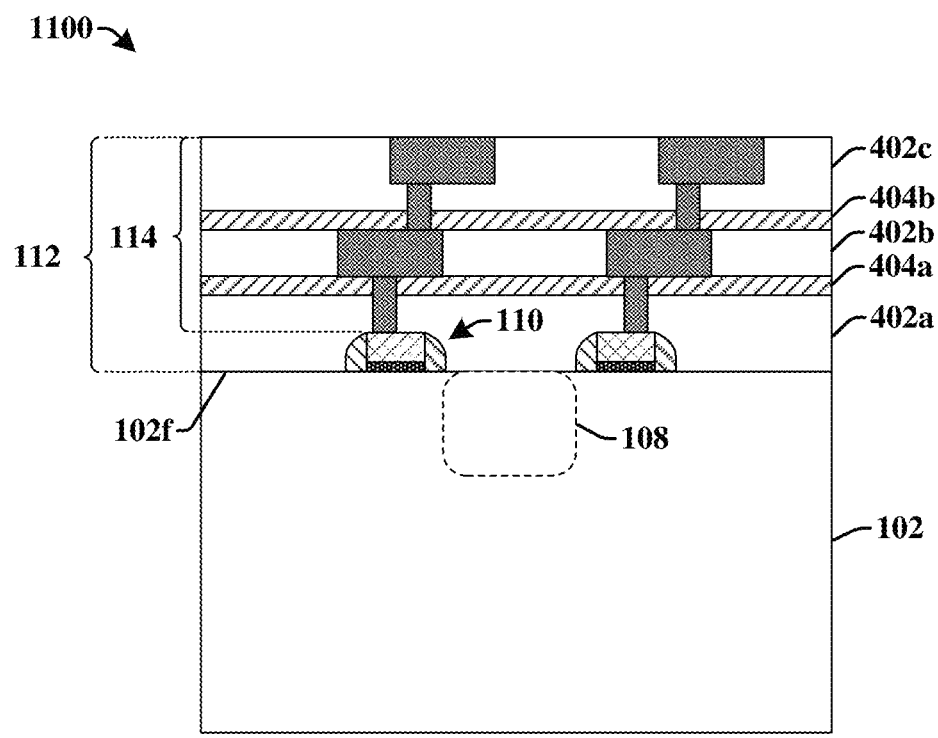

As shown in cross-sectional view 1100 of FIG. 11, a plurality of conductive interconnect layers 114 are formed within a dielectric structure 112 formed along the front-side 102f of the substrate 102. In some embodiments, the dielectric structure 112 may comprise a plurality of stacked ILD layers 402a-402c vertically separated from one another by etch stop layers 404a-404b. In some embodiments, the plurality of conductive interconnect layers 114 may be respectively formed using a damascene process (e.g., a single damascene process or a dual damascene process). The damascene process is performed by forming one of the plurality of stacked ILD layers 402a-402c on the substrate 102, etching the ILD layer to form a via hole and/or a metal trench, and filling the via hole and/or metal trench with a conductive material. In some embodiments, the ILD layer may be deposited by a physical vapor deposition technique (e.g., PVD, CVD, PE-CVD, ALD, etc.) and the conductive material (e.g., tungsten, copper, aluminum, or the like) may be formed using a deposition process and/or a plating process (e.g., electroplating, electro-less plating, etc.).

As shown in cross-sectional view 1200 of FIG. 12, the dielectric structure 112 is bonded to a carrier substrate 1202. In some embodiments, the bonding process may use an intermediate bonding oxide layer (not shown) arranged between the dielectric structure 112 and the carrier substrate 1202. In some embodiments, the bonding process may comprise a fusion bonding process. In some embodiments, the carrier substrate 1202 may comprise a silicon substrate.

As shown in cross-sectional view 1300 of FIG. 13, the substrate 102 may be thinned to reduce a thickness of the substrate 102. In various embodiments, the substrate 102 may be thinned by etching and/or mechanical grinding the back-side 102b of the substrate 102 to reduce the thickness of the substrate 102 from a first thickness $t_1$ to a second thickness $t_2$. In some embodiments, the first thickness $t_1$ may be in a range of between approximately 700 µm and approximately 800 µm. In some embodiments, the second thickness $t_2$ may be in a range of between approximately 20 µm and approximately 80 µm.

Figure 14:
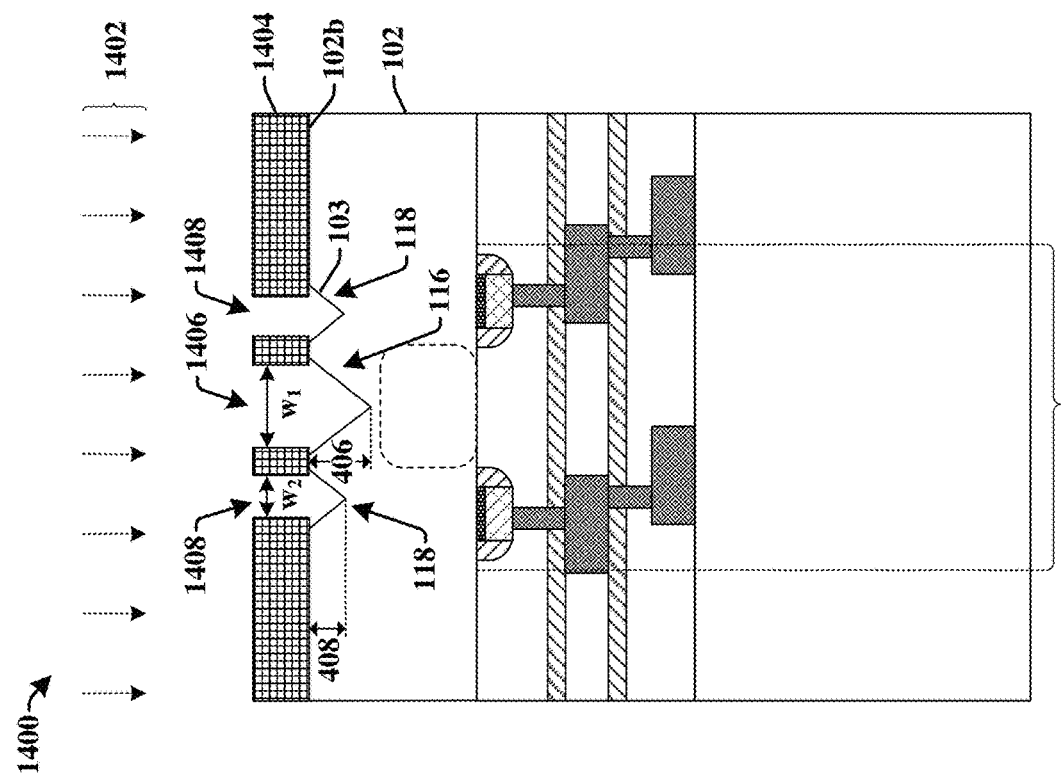

As shown in cross-sectional view 1400 of FIG. 14, a central diffuser 116 and a plurality of peripheral diffusers 118 are formed along the back-side 102b of the substrate 102. The plurality of peripheral diffusers 118 are formed to laterally surround the central diffuser 116. The central diffuser 116 has a first size (e.g., a first width and a first depth). The plurality of peripheral diffusers 118 respectively have a second size (e.g., a second width and a second depth) that is larger than the first size.

In some embodiments, the central diffuser 116 and the plurality of peripheral diffusers 118 may be formed by selectively exposing the back-side 102b of the substrate 102 to a first etchant 1402 according to a second masking layer 1404. The second masking layer 1404 comprises a first opening 1406 having a first width $w_1$ and a plurality of second openings 1408 respectively having a second width $w_2$ that is smaller than the first width $w_1$. The first etchant 1402 removes unmasked parts of the substrate 102 to form angled surfaces 103 that simultaneously define the central diffuser 116 and the plurality of peripheral diffusers 118. In some embodiments, the first etchant 1402 may comprise a wet etchant (e.g., hydrofluoric acid, potassium hydroxide, or the like). Because the first width $w_1$ of the first opening 1406 is larger than the second width $w_2$ of the plurality of second openings 1408, more of the first etchant 1402 is able to etch the substrate 102 within the first opening 1406 than within the second opening 1408. This results in the central diffuser 116 being formed to a first maximum depth 406 that is greater than one or more second maximum depths 408 of the plurality of peripheral diffusers 118. In other embodiments, the first etchant 1402 may comprise a dry etchant. In some alternative embodiments (not shown), the central diffuser 116 may be formed by a separate etching process than the plurality of peripheral diffusers 118.

Figure 15:
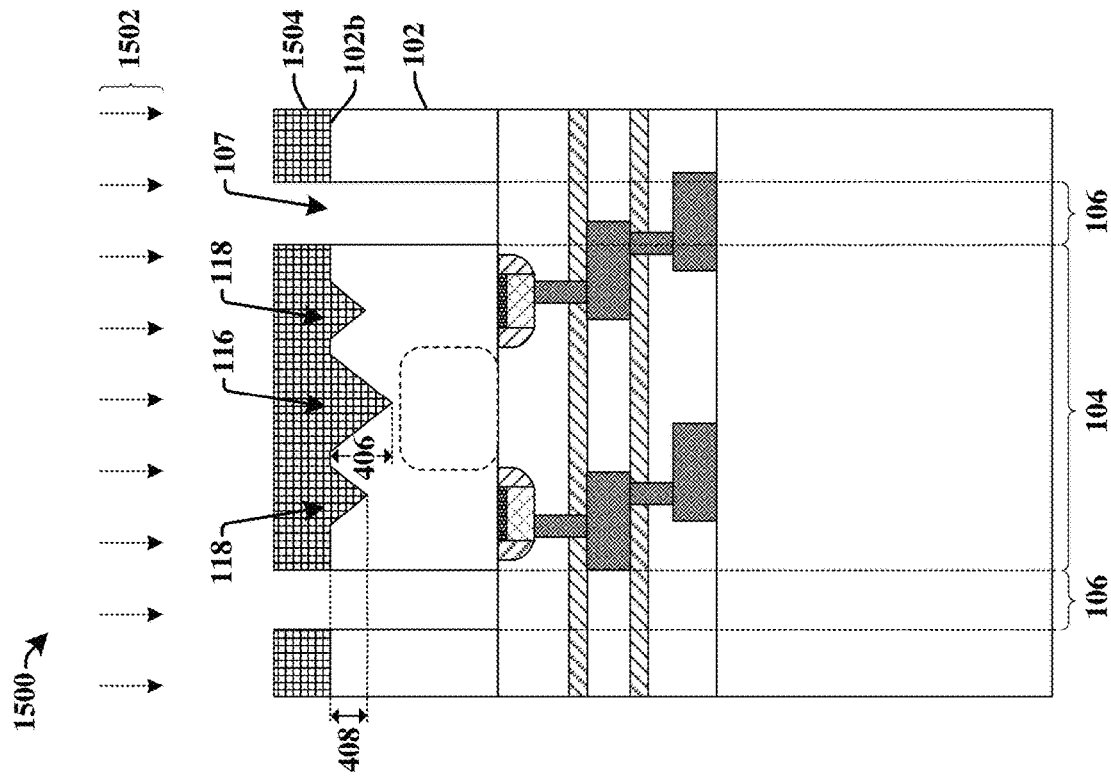

As shown in cross-sectional view 1500 of FIG. 15, one or more isolation trenches 107 are formed within isolation regions 106 disposed along opposing sides of the pixel region 104. The one or more isolation trenches 107 extend into the back-side 102b of the substrate 102 to a third maximum depth that is greater than both the first maximum depth 406 of the central diffuser 116 and the one or more second maximum depths 408 of the plurality of peripheral diffusers 118. In some embodiments, the one or more isolation trenches 107 may be formed by selectively exposing the back-side 102b of the substrate 102 to a second etchant 1502 according to a third masking layer 1504. The second etchant 1502 removes unmasked parts of the substrate 102 to define the one or more isolation trenches 107. In some embodiments, the second etchant 1502 may comprise a dry etchant.

Figure 16:
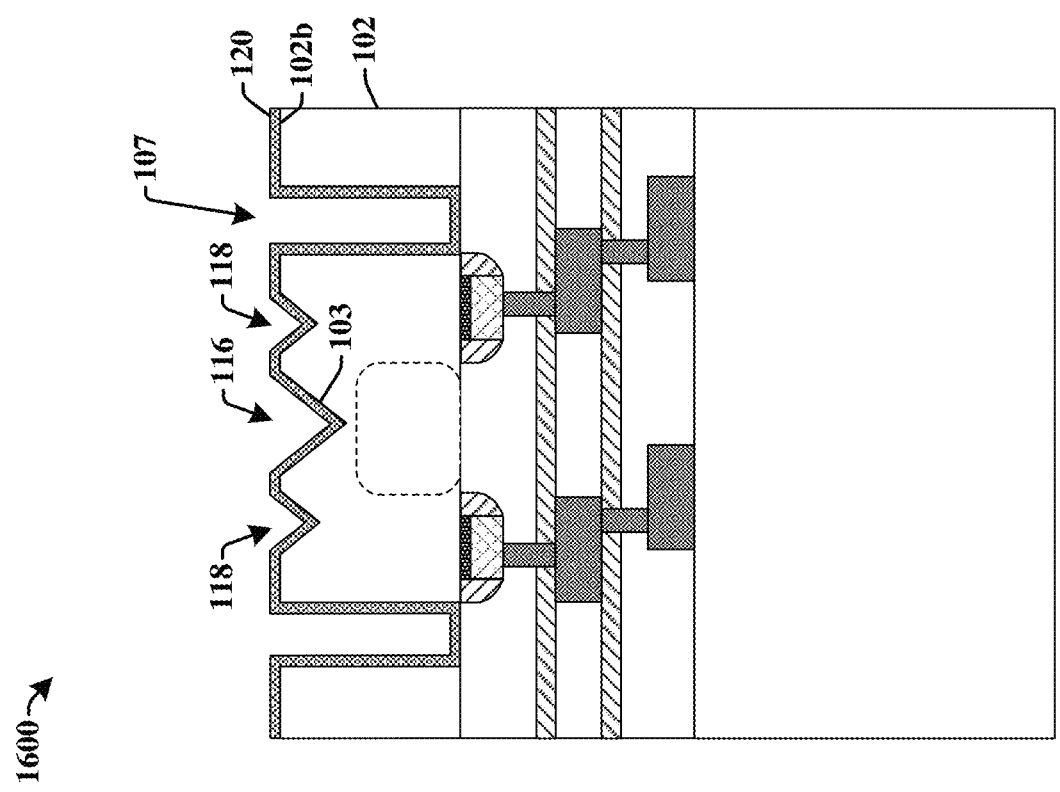

As shown in cross-sectional view 1600 of FIG. 16, an anti-reflective material 120 is formed along the back-side 102b of the substrate 102. The anti-reflective material 120 lines the angled surfaces 103 defining the central diffuser 116 and the plurality of peripheral diffusers 118. In some embodiments, the anti-reflective material 120 may also extend to within the one or more isolation trenches 107. In some embodiments, the anti-reflective material 120 may comprise a high-k dielectric material including hafnium oxide, titanium oxide, hafnium zirconium oxide, tantalum oxide, hafnium silicon oxide, zirconium oxide, zirconium silicon oxide, etc. In some embodiments, the anti-reflective material 120 may be deposited by a deposition technique (e.g., PVD, CVD, PE-CVD, ALD, etc.).

Figure 17:
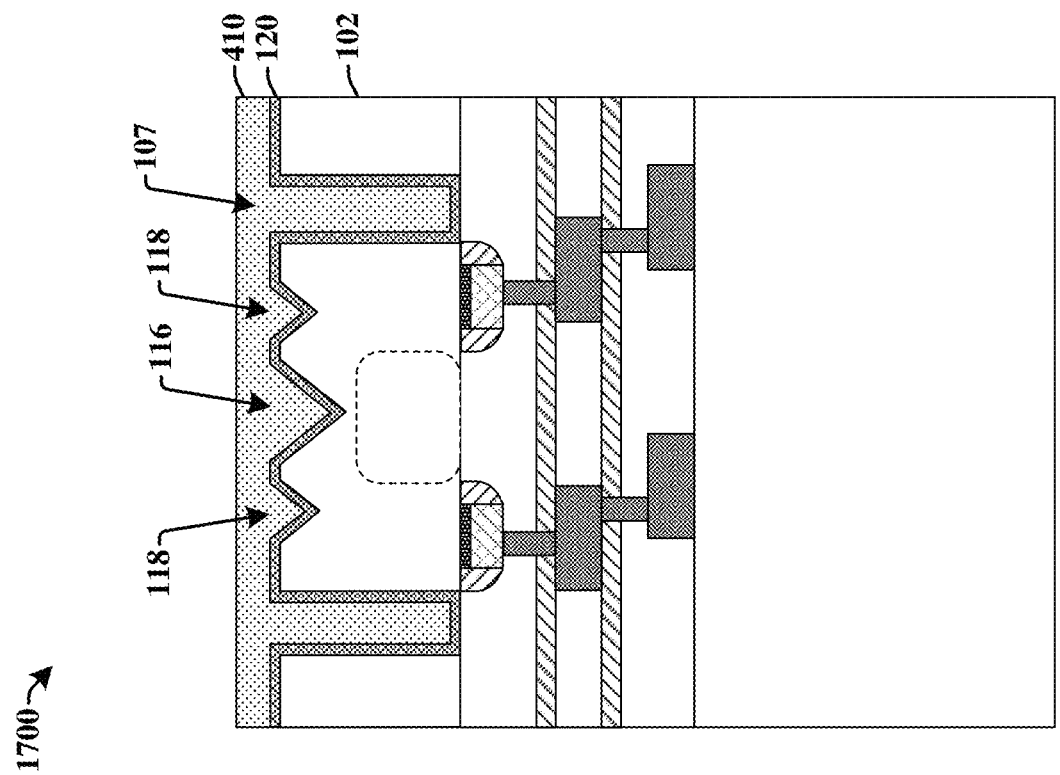

As shown in cross-sectional view 1700 of FIG. 17, a first dielectric layer 410 is formed on the anti-reflective material 120. The first dielectric layer 410 fills the central diffuser 116 and the plurality of peripheral diffusers 118. In some embodiments, the first dielectric layer 410 may further fill the one or more isolation trenches 107. In some embodiments, the first dielectric layer 410 may include an oxide (e.g., silicon oxide), a nitride (e.g., silicon nitride), or the like. The first dielectric layer 410 may undergo a subsequent planarization process (e.g., a chemical mechanical planarization process) to form a substantially planar surface.

Figure 18:
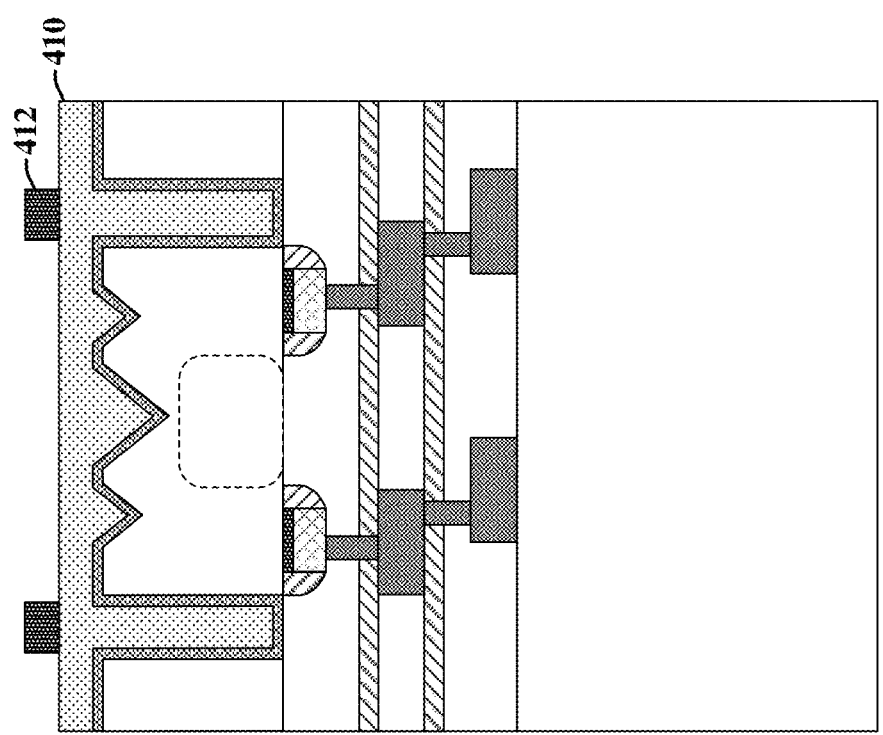

As shown in cross-sectional view 1800 of FIG. 18, one or more grid elements 412 are formed over the first dielectric layer 410. The one or more grid elements 412 can include a metal (e.g., aluminum, cobalt, copper, silver, gold, tungsten, etc.) and/or a dielectric material (e.g., silicon oxide, silicon nitride, etc.). In some embodiments, the one or more grid elements 412 may be formed by depositing a metal over the first dielectric layer 410 using a deposition technique (e.g., PVD, CVD, PE-CVD, ALD, etc.) and/or a plating technique. The metal is subsequently patterned to define the one or more grid elements 412.

Figure 19:
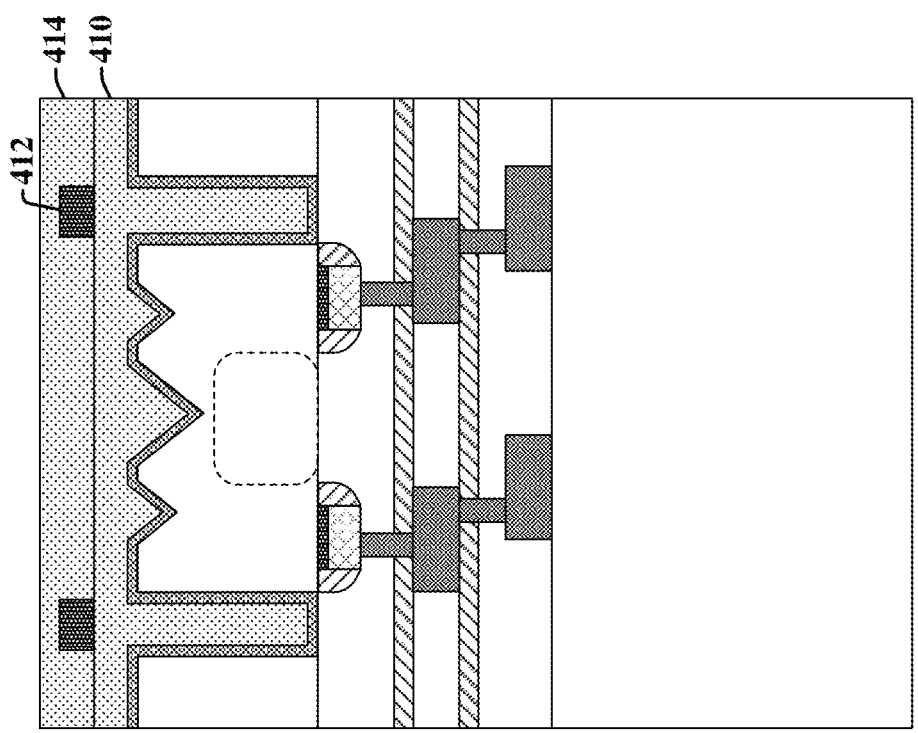

As shown in cross-sectional view 1900 of FIG. 19, a second dielectric layer 414 is formed over the first dielectric layer 410 and the one or more grid elements 412. In some embodiment, the second dielectric layer 414 can include an oxide (e.g., silicon oxide), a nitride, or the like. In some embodiments, the second dielectric layer 414 may undergo a subsequent planarization process (e.g., a chemical mechanical planarization process) to form a substantially planar surface.

Figure 20:
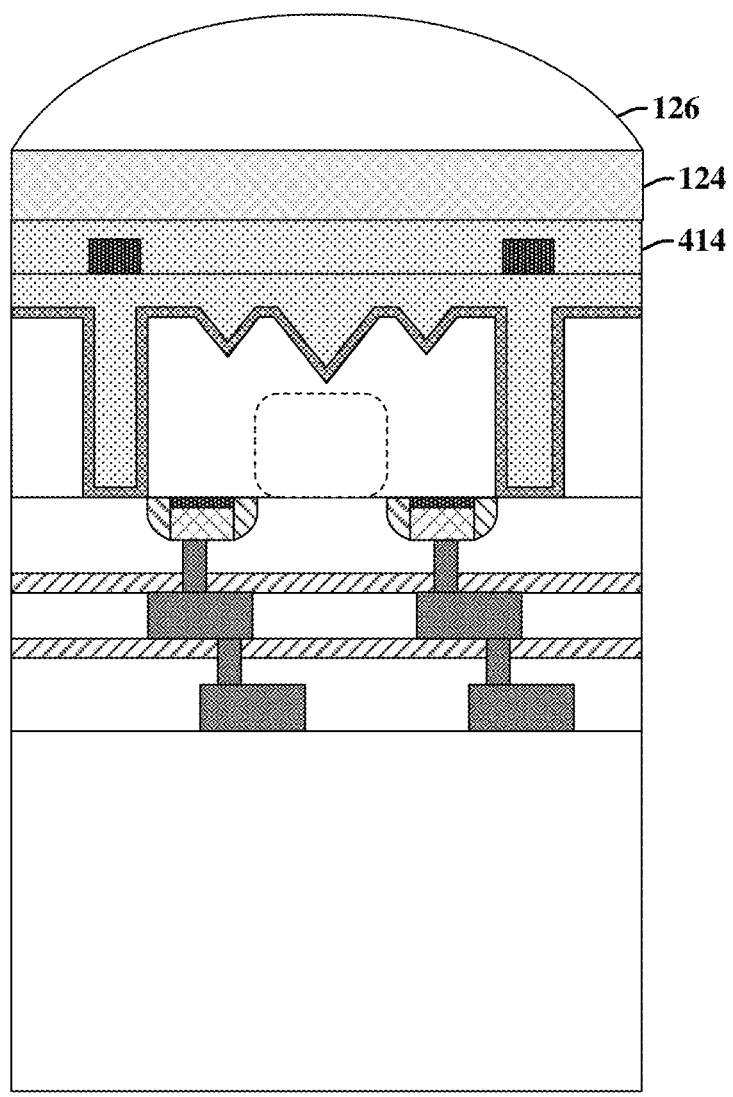

As shown in cross-sectional view 2000 of FIG. 20, a color filter 124 is formed over the second dielectric layer 414. A micro-lens 126 may be subsequently formed over the color filter 124.

In some embodiments, the color filter 124 is formed of a material that allows for the transmission of radiation (e.g., light) having a specific range of wavelength, while blocking light of wavelengths outside of the specified range. In some embodiments, micro-lens 126 may be formed by depositing a micro-lens material above the color filter 124 (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The micro-lens 126 can then be formed by selectively etching the micro-lens material according to the micro-lens template.

Figure 21:
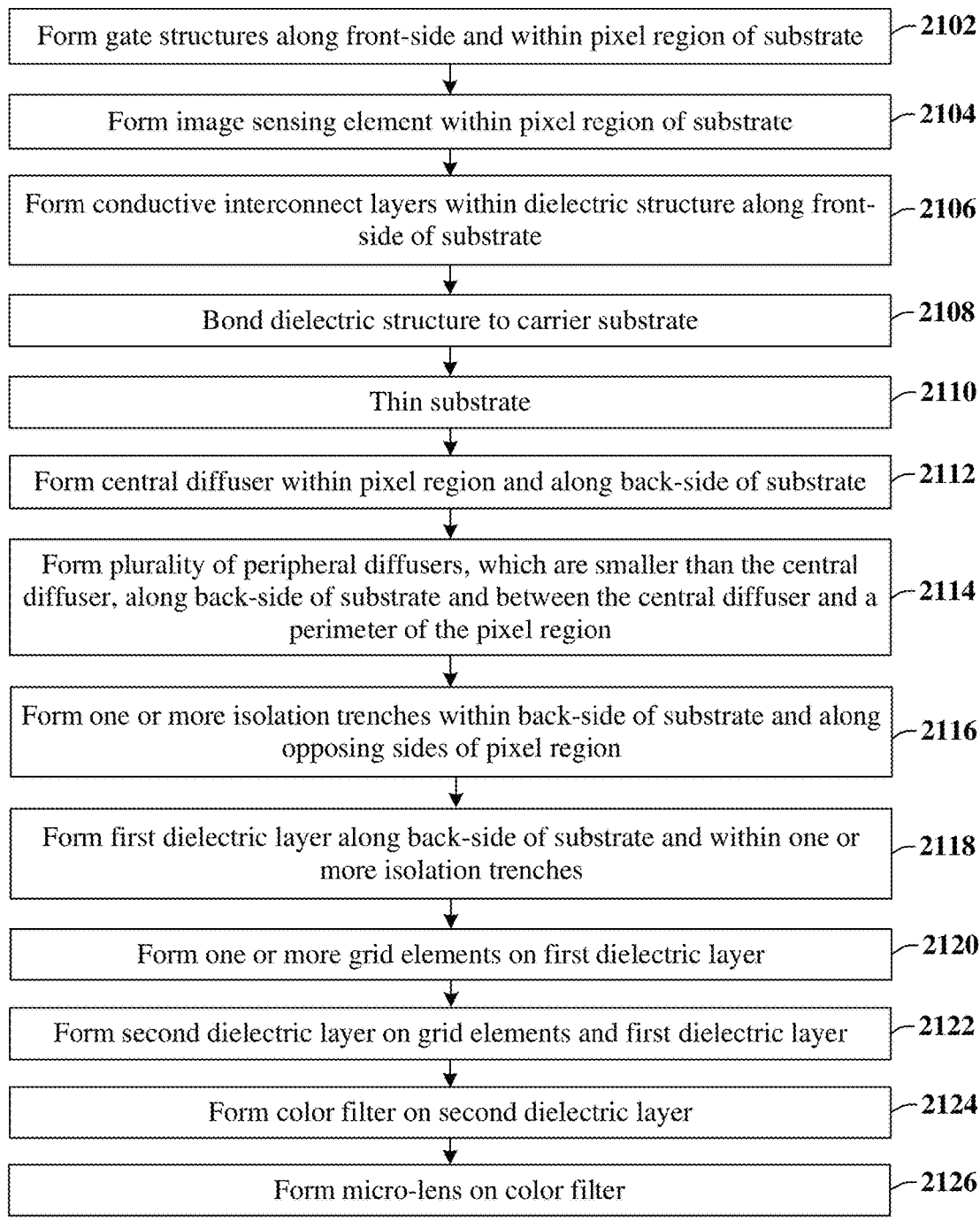
FIG. 21 illustrates a flow diagram of some embodiments of a method of forming an image sensor IC having different sized diffusers.

FIG. 21 illustrates a flow diagram of some embodiments of a method 2100 of forming an image sensor IC having different sized diffusers.

While method 2100 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2102, one or more gate structures are formed along a front-side and within a pixel region of a substrate. FIG. 9 illustrates a cross-sectional view 900 of some embodiments corresponding to act 2102.

At 2104, an image sensing element is formed within the pixel region of the substrate. FIG. 10 illustrates a cross-sectional view 1000 of some embodiments corresponding to act 2104.

At 2106, a plurality of conductive interconnect layers are formed within a dielectric structure along the front-side of the substrate. FIG. 11 illustrates a cross-sectional view 1100 of some embodiments corresponding to act 2106.

At 2108, the dielectric structure is bonded to a carrier substrate. FIG. 12 illustrates a cross-sectional view 1200 of some embodiments corresponding to act 2108.

At 2110, the substrate is thinned to reduce a thickness of the substrate. FIG. 13 illustrates a cross-sectional view 1300 of some embodiments corresponding to act 2110.

At 2112, a central diffuser having a first size is formed within the pixel region and along a back-side of the substrate. FIG. 14 illustrates a cross-sectional view 1400 of some embodiments corresponding to act 2112.

At 2114, a plurality of peripheral diffusers having one or more second sizes, which are smaller than the first size, are formed along the back-side of the substrate and between the central diffuser and a perimeter of the pixel region. FIG. 15 illustrates a cross-sectional view 1500 of some embodiments corresponding to act 2114.

At 2116, one or more isolation trenches are formed within the back-side of the substrate and along opposing sides of the pixel region. FIG. 16 illustrates a cross-sectional view 1600 of some embodiments corresponding to act 2116.

At 2118, a first dielectric layer is formed along the back-side of the substrate and within the one or more isolation trenches. FIG. 17 illustrates a cross-sectional view 1700 of some embodiments corresponding to act 2118.

At 2120, one or more grid elements are formed on the first dielectric layer. FIG. 18 illustrates a cross-sectional view 1800 of some embodiments corresponding to act 2120.

At 2122, a second dielectric layer is formed on the one or more grid elements and the first dielectric layer. FIG. 19 illustrates a cross-sectional view 1900 of some embodiments corresponding to act 2122.

At 2124, a color filter is formed on the second dielectric layer. FIG. 20 illustrates a cross-sectional view 2000 of some embodiments corresponding to act 2124.

At 2126, a micro-lens is formed on the color filter. FIG. 20 illustrates a cross-sectional view 2000 of some embodiments corresponding to act 2126.

Accordingly, the present disclosure relates to an image sensor integrated chip having different sized diffusers (e.g., a large central diffuser surrounded by a plurality of smaller peripheral diffusers) disposed along a back-side of a substrate and configured to improve a quantum efficiency of an image sensor.

In some embodiments, the present disclosure relates to an integrated chip. The integrated chip includes an image sensing element disposed within a substrate; a gate structure disposed along a front-side of the substrate; a back-side of the substrate includes one or more first angled surfaces defining a central diffuser disposed over the image sensing element; and the back-side of the substrate further includes second angled surfaces defining a plurality of peripheral diffusers laterally surrounding the central diffuser, the plurality of peripheral diffusers are a smaller size than the central diffuser. In some embodiments, the central diffuser has a greater maximum width than respective ones of the plurality of peripheral diffusers. In some embodiments, the central diffuser has a greater maximum depth than respective ones of the plurality of peripheral diffusers. In some embodiments, the plurality of peripheral diffusers surround the central diffuser along a first direction and along a second direction that is perpendicular to the first direction. In some embodiments, the integrated chip further includes a second central diffuser laterally surrounded by the plurality of peripheral diffusers, the second central diffuser is larger than respective ones of the plurality of peripheral diffusers. In some embodiments, the one or more first angled surfaces meet at a first point that is at a bottom of the central diffuser; and one or more of the second angled surfaces meet at a second point that is at a bottom of one of the plurality of peripheral diffusers. In some embodiments, the image sensing element is disposed within a pixel region; and the central diffuser is closer to a center of the pixel region than the plurality of peripheral diffusers. In some embodiments, the integrated chip further includes a micro-lens disposed along the back-side of the substrate, the central diffuser is closer to a center of the micro-lens than respective ones of the plurality of peripheral diffusers. In some embodiments, the micro-lens has an f-number of greater than approximately f/3. In some embodiments, the back-side of the substrate is substantially flat between the central diffuser and the plurality of peripheral diffusers.

In other embodiments, the present disclosure relates to an integrated chip. The integrated chip includes an image sensing element disposed within a pixel region of a semiconductor substrate; a plurality of interconnect layers disposed within a dielectric structure along a front-side of the semiconductor substrate; the semiconductor substrate defines a first tapered cavity disposed along a back-side of the semiconductor substrate and within the pixel region; the semiconductor substrate further defines a plurality of second tapered cavities along the back-side of the semiconductor substrate and between the first tapered cavity and a perimeter of the pixel region; and the first tapered cavity has a first maximum width that is larger than maximum widths of the plurality of second tapered cavities. In some embodiments, the first tapered cavity is configured to be disposed directly below a center of an overlying micro-lens. In some embodiments, the first tapered cavity is surrounded by the plurality of second tapered cavities along a first direction and along a second direction that is perpendicular to the first direction. In some embodiments, the image sensing element is configured to have a quantum efficiency that is greater than approximately 45% for incident radiation that intersects a line that is perpendicular to the back-side of the semiconductor substrate at angles of between approximately −20° and approximately 20°. In some embodiments, a quantum efficiency of the image sensing element has a maximum value for incident radiation that intersects a line that is perpendicular to the back-side of the semiconductor substrate at angles of between approximately −10° and approximately 10°. In some embodiments, the plurality of second tapered cavities are substantially symmetric about a center of the first tapered cavity as viewed in a top-view of the first tapered cavity. In some embodiments, the integrated chip further includes one or more dielectric materials disposed within one or more isolation trenches arranged within the semiconductor substrate along opposing sides of the pixel region, the first tapered cavity and the plurality of second tapered cavities are laterally surrounded by the one or more isolation trenches. In some embodiments, the first tapered cavity laterally extends past opposing sides of a first one of the plurality of second tapered cavities along a first direction and laterally extends past opposing sides of a second one of the plurality of second tapered cavities along a second direction that is perpendicular to the first direction.

In yet other embodiments, the present disclosure relates to a method of forming an integrated chip. The method includes forming an image sensing element within a pixel region of a substrate; forming a plurality of interconnect layers within a dielectric structure along a front-side of the substrate; forming a masking layer along a back-side of the substrate, the masking layer including a first opening having a first width and a plurality of second openings having one or more second widths that are respectively smaller than the first width; performing an etching process to selectively etch the back-side of the substrate according to the masking layer to define a central diffuser surrounded by a plurality of peripheral diffusers; and the central diffuser has a greater width and depth than respective ones of the plurality of peripheral diffusers. In some embodiments, the plurality of peripheral diffusers are between the central diffuser and a perimeter of the pixel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
   forming an image sensing element within a pixel region of a substrate;
   forming a plurality of interconnect layers within a dielectric structure along a front-side of the substrate;
   forming a masking layer along a back-side of the substrate, wherein the masking layer comprises a first opening having a first width and a plurality of second openings having one or more second widths that are respectively smaller than the first width;
   performing an etching process to selectively etch the back-side of the substrate according to the masking layer to define a central diffuser laterally surrounded on opposing sides by a plurality of peripheral diffusers, wherein the back-side of the substrate comprises a substantially flat surface laterally extending between peripheries of the central diffuser and an adjacent one of the plurality of peripheral diffusers;
   wherein the central diffuser has a greater width and depth than respective ones of the plurality of peripheral diffusers; and
   wherein a first pair of the plurality of peripheral diffusers is arranged on opposing sides of the central diffuser and along a first line that bisects the central diffuser in a top-view of the central diffuser, and a second pair of the plurality of peripheral diffusers is arranged on opposing sides of the central diffuser and along a second line, the second line being perpendicular to the first line and bisecting the central diffuser in the top-view of the central diffuser.

2. The method of claim 1, wherein the central diffuser has a width that is in a range of between approximately 1.5 μm and approximately 2.5 μm and the plurality of peripheral diffusers respectively have a width that is in a range of between approximately 0.5 μm and 1.0 μm.

3. The method of claim 1, further comprising:
   performing a second etching process to selectively etch the back-side of the substrate according to a second masking layer to form one or more trenches arranged along opposing sides of the pixel region; and
   forming one or more dielectric materials within the one or more trenches.

4. The method of claim 1, wherein the central diffuser has a square shape and both the first line and the second line diagonally bisect the central diffuser, as viewed in the top-view of the central diffuser.

5. The method of claim 1, wherein the central diffuser and the plurality of peripheral diffusers respectively comprise pyramidal shaped cavities.

6. The method of claim 1, wherein the central diffuser consists of a single central diffuser having opposing angled sidewalls directly coupled to a flat surface, the flat surface being further directly coupled to an angled sidewall of the plurality of peripheral diffusers.

7. A method of forming an integrated chip, comprising:
forming an image sensor within a substrate;
forming a mask on the substrate, wherein the mask comprises a first opening having a first width and a plurality of second openings having one or more second widths that are respectively smaller than the first width;
performing one or more etching processes to selectively etch the substrate according to the mask to form a plurality of central diffusers and a plurality of peripheral diffusers, the plurality of peripheral diffusers laterally surrounding the plurality of central diffusers; and
wherein the plurality of central diffusers respectively comprise a square pyramidal shaped recess formed by four angled sidewalls, two of the four angled sidewalls intersecting an angled sidewall forming a neighboring one of the plurality of central diffusers and another two of the four angled sidewalls being directly coupled to a substantially flat surface that separates the plurality of central diffusers from the plurality of peripheral diffusers.

8. The method of claim 7, wherein the plurality of peripheral diffusers laterally extend past outermost edges of the plurality of central diffusers along a first direction and along a perpendicular second direction as viewed in a top-view.

9. The method of claim 7,
wherein the image sensor is disposed within a pixel region; and
wherein the plurality of central diffusers are closer to a center of the pixel region than the plurality of peripheral diffusers.

10. The method of claim 7, wherein the plurality of peripheral diffusers are between the plurality of central diffusers and an isolation structure extending along a perimeter of a pixel region comprising the image sensor.

11. A method of forming an integrated chip, comprising:
forming an image sensor within a substrate;
forming a mask on the substrate; and
selectively etching a back-side of the substrate according to the mask to form a plurality of central tapered cavities laterally surrounded by a plurality of peripheral tapered cavities, wherein the plurality of central tapered cavities have a larger size than respective ones of the plurality of peripheral tapered cavities;
wherein neighboring ones of the plurality of central tapered cavities are formed by angled sidewalls that intersect one another; and
wherein neighboring ones of the plurality of peripheral tapered cavities are separated from one another by a flat surface that continuously extends from directly between the neighboring ones of the plurality of peripheral tapered cavities along a first direction to directly between the plurality of peripheral tapered cavities and the plurality of central tapered cavities along a second direction, the first direction being perpendicular to the second direction in a top-view.

12. The method of claim 11, further comprising:
forming one or more dielectric materials within one or more isolation trenches formed within the substrate, wherein the plurality of central tapered cavities and the plurality of peripheral tapered cavities are laterally surrounded by the one or more isolation trenches.

13. The method of claim 12, wherein the plurality of central tapered cavities are arranged in a square shaped array having four sides, the plurality of peripheral tapered cavities arranged along the four sides of the square shaped array, as viewed in a plan-view.

14. The method of claim 11, wherein the plurality of peripheral tapered cavities extend past the plurality of central tapered cavities in the first direction and in the second direction, as viewed in a plan-view.

15. The method of claim 11, wherein the plurality of central tapered cavities respectively have a greater maximum depth than the respective ones of the plurality of peripheral tapered cavities.

16. The method of claim 11, wherein sidewalls of the plurality of central tapered cavities intersect at a point that is centered between the plurality of peripheral tapered cavities.

17. The method of claim 11, wherein the plurality of central tapered cavities consist of four central tapered cavities arranged in a square pattern, as viewed in a plan-view.

18. The method of claim 11, wherein the plurality of central tapered cavities are arranged in a 2×2 array, as viewed in a plan-view.

19. The method of claim 11, wherein the plurality of peripheral tapered cavities surround the plurality of central tapered cavities along the first direction and along the second direction in the top-view.

20. The method of claim 11, wherein the plurality of peripheral tapered cavities are substantially symmetrically disposed about a center of the plurality of central tapered cavities along the first direction and along the second direction in the top-view.

* * * * *